United States Patent
Hirose et al.

(10) Patent No.: US 12,106,823 B2
(45) Date of Patent: Oct. 1, 2024

(54) SEMICONDUCTOR DEVICE USING TRANSISTORS HAVING LOW OFF-STATE CURRENT

(71) Applicant: Semiconductor Energy Laboratory Co., Ltd., Atsugi (JP)

(72) Inventors: Takeya Hirose, Atsugi (JP); Seiichi Yoneda, Isehara (JP); Takayuki Ikeda, Atsugi (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 52 days.

(21) Appl. No.: 17/914,845

(22) PCT Filed: Apr. 6, 2021

(86) PCT No.: PCT/IB2021/052826
§ 371 (c)(1),
(2) Date: Sep. 27, 2022

(87) PCT Pub. No.: WO2021/209858
PCT Pub. Date: Oct. 21, 2021

(65) Prior Publication Data
US 2023/0147770 A1    May 11, 2023

(30) Foreign Application Priority Data

Apr. 17, 2020 (JP) ................................. 2020-073841
Apr. 23, 2020 (JP) ................................. 2020-076478

(51) Int. Cl.
*G11C 7/16*    (2006.01)
*G11C 11/40*    (2006.01)
(Continued)

(52) U.S. Cl.
CPC ................ *G11C 7/16* (2013.01); *G11C 11/40* (2013.01); *G11C 27/02* (2013.01); *H01L 29/786* (2013.01); *G11C 11/54* (2013.01)

(58) Field of Classification Search
CPC ........... G11C 7/16; G11C 11/40; G11C 27/02; G11C 11/54; H01L 29/786
See application file for complete search history.

(56) References Cited

U.S. PATENT DOCUMENTS

| | | | |
|---|---|---|---|
| 6,262,907 B1* | 7/2001 | Lien ..................... | G11C 15/046 365/189.07 |
| 6,859,377 B2* | 2/2005 | Yamagata ............ | G11C 15/043 365/203 |

(Continued)

FOREIGN PATENT DOCUMENTS

| CN | 001433143 A | 7/2003 |
|---|---|---|
| JP | 2003-283272 A | 10/2003 |

(Continued)

OTHER PUBLICATIONS

International Search Report (Application No. PCT/IB2021/052826) Dated Jul. 13, 2021.

(Continued)

*Primary Examiner* — Vanthu T Nguyen
(74) *Attorney, Agent, or Firm* — Eric J. Robinson; Robinson Intellectual Property Law Office, P.C.

(57) ABSTRACT

A semiconductor device capable of holding analog data is provided. Two holding circuits, two bootstrap circuits, and one source follower circuit are formed with use of four transistors and two capacitors. A memory node is provided in each of the two holding circuits; a data potential is written to one of the memory nodes and a reference potential is written to the other of the memory nodes. At the time of data reading, the potential of the one memory node is increased in one of the bootstrap circuits, and the potential of the other (Continued)

memory node is increased in the other of the bootstrap circuits. A potential difference between the two memory nodes is output by the source follower circuit. With use of the source follower circuit, the output impedance can be reduced.

13 Claims, 25 Drawing Sheets

(51) Int. Cl.
  *G11C 27/02* (2006.01)
  *H01L 29/786* (2006.01)
  *G11C 11/54* (2006.01)

(56) References Cited

U.S. PATENT DOCUMENTS

| | | | |
|---|---|---|---|
| 6,891,356 B2 | 5/2005 | Kimura et al. | |
| 7,248,031 B2 | 7/2007 | Kimura et al. | |
| 7,456,625 B2 | 11/2008 | Kimura et al. | |
| 7,764,058 B2 | 7/2010 | Kimura et al. | |
| 8,085,028 B2 | 12/2011 | Kimura et al. | |
| 8,314,601 B2 | 11/2012 | Kimura et al. | |
| 8,514,642 B2* | 8/2013 | Koyama | H10B 41/00 365/225.7 |
| 8,614,916 B2 | 12/2013 | Nagatsuka et al. | |
| 9,240,244 B2 | 1/2016 | Nagatsuka et al. | |
| 9,472,293 B2 | 10/2016 | Nagatsuka et al. | |
| 9,716,100 B2 | 7/2017 | Atsumi et al. | |
| 9,748,274 B2* | 8/2017 | Ishizu | H01L 27/1255 |
| 9,998,104 B2 | 6/2018 | Matsuzaki et al. | |
| 2003/0142520 A1 | 7/2003 | Kimura et al. | |
| 2011/0051484 A1* | 3/2011 | Chu | G11C 15/043 365/49.17 |
| 2012/0033488 A1 | 2/2012 | Nagatsuka et al. | |
| 2014/0269099 A1 | 9/2014 | Nagatsuka et al. | |
| 2015/0263008 A1 | 9/2015 | Atsumi et al. | |
| 2016/0149567 A1 | 5/2016 | Matsuzaki et al. | |
| 2016/0203871 A1 | 7/2016 | Nagatsuka et al. | |

FOREIGN PATENT DOCUMENTS

| | | |
|---|---|---|
| JP | 2012-256400 A | 12/2012 |
| JP | 2014-199707 A | 10/2014 |
| JP | 2015-195074 A | 11/2015 |
| JP | 2016-105343 A | 6/2016 |
| KR | 2003-0063188 A | 7/2003 |
| KR | 2015-0107672 A | 9/2015 |
| TW | 200303644 | 9/2003 |

OTHER PUBLICATIONS

Written Opinion (Application No. PCT/IB2021/052826) Dated Jul. 13, 2021.

* cited by examiner

180A

180B

1150C

1150C $a = x_1 w_1 + x_2 w_2 + b$

FIG. 18A
Intermediate state
New crystalline phase
| Amorphous | Crystalline | Crystal |
|---|---|---|
| •completely amorphous | •CAAC<br>•nc<br>•CAC<br><br>excluding single crystal and poly crystal | •single crystal<br>•poly crystal |
FIG. 18B
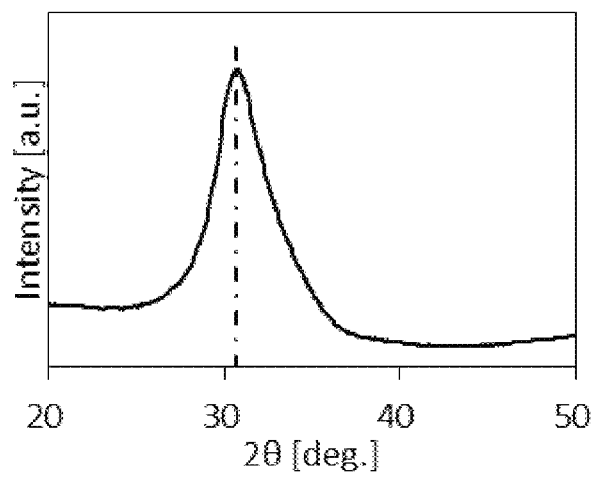
FIG. 18C
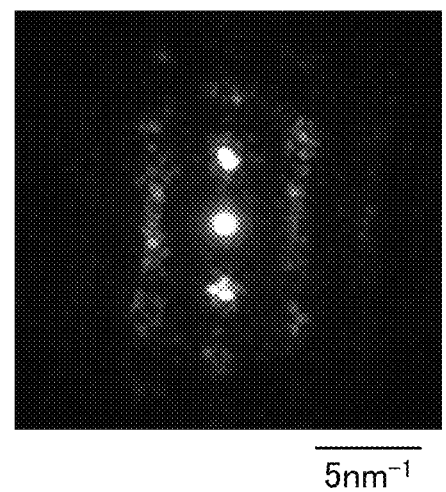

SEMICONDUCTOR DEVICE USING TRANSISTORS HAVING LOW OFF-STATE CURRENT

TECHNICAL FIELD

One embodiment of the present invention relates to a semiconductor device.

Note that one embodiment of the present invention is not limited to the above technical field. The technical field of the invention disclosed in this specification and the like relates to an object, a method, or a manufacturing method. Another embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, and a testing method thereof.

BACKGROUND ART

In recent years, electronic components such as central processing units (CPUs), graphics processing units (GPUs), memory devices, and sensors have been used in various electronic devices such as personal computers, smartphones, and digital cameras. The electronic components have been improved in various aspects such as miniaturization and low power consumption.

In particular, the data amount processed in the electronic devices has increased in recent years, and thus, memory devices with large memory capacity have been required. Thus, the development of a memory device that holds multilevel data or analog data in one memory element has been studied. Patent Document 1 and Patent Document 2 each disclose a semiconductor device enabling writing and reading of multilevel data.

REFERENCE

Patent Document

[Patent Document 1] Japanese Published Patent Application No. 2012-256400
[Patent Document 2] Japanese Published Patent Application No. 2014-199707

SUMMARY OF THE INVENTION

Problems to be Solved by the Invention

A semiconductor device capable of holding analog data for a long period and accurately reading analog data held is required.

Miniaturization of elements in a transistor including silicon in a semiconductor layer where a channel is formed (also referred to as a "Si transistor") progresses with shrinking design rules. The miniaturization of elements results in a thinner gate insulating film, thereby posing a problem of leakage current through the gate insulating film.

One object of one embodiment of the present invention is to provide a semiconductor device capable of holding analog data. Another object of one embodiment of the present invention is to provide a semiconductor device capable of accurately reading analog data held. Another object of one embodiment of the present invention is to provide a semiconductor device with a reduced occupied area. Another object of one embodiment of the present invention is to provide a semiconductor device with reduced power consumption. Another object of one embodiment of the present invention is to provide a semiconductor device with large memory capacity. Another object of one embodiment of the present invention is to provide a highly reliable semiconductor device. Another object of one embodiment of the present invention is to provide a novel semiconductor device.

Note that the objects of one embodiment of the present invention are not limited to the objects listed above. The objects listed above do not preclude the existence of other objects. Note that the other objects are objects that are not described in this section and will be described below. The objects that are not described in this section will be derived from the description of the specification, the drawings, and the like and can be extracted as appropriate from the description by those skilled in the art. Note that one embodiment of the present invention achieves at least one of the objects listed above and the other objects. Note that one embodiment of the present invention does not necessarily achieve all the objects listed above and the other objects.

Means for Solving the Problems

One embodiment of the present invention is a semiconductor device in which two holding circuits, two bootstrap circuits, and one source follower circuit are formed with use of four transistors and two capacitors. A memory node is provided in each of the two holding circuits; a data potential is written to one of the memory nodes and a reference potential is written to the other of the memory nodes. At the time of data reading, the potential of the one memory node is increased in one of the bootstrap circuits, and the potential of the other memory node is increased in the other of the bootstrap circuits. A potential difference between the two memory nodes is output by the source follower circuit. With use of the source follower circuit, the output impedance can be reduced.

Another embodiment of the present invention is a semiconductor device including first to fifth circuits. The first circuit has a function of holding a first potential. The second circuit has a function of increasing the first potential. The third circuit has a function of holding a second potential. The fourth circuit has a function of increasing the second potential. The fifth circuit has a function of outputting a third potential corresponding to a potential difference between the increased first potential and the increased second potential.

The above-described semiconductor device may include, for example, first to fourth transistors, a first capacitor, and a second capacitor. The first circuit may include the first transistor and the first capacitor. The second circuit may include the second transistor and the first capacitor. The third circuit may include the third transistor and the second capacitor. The fourth circuit may include the fourth transistor and the second capacitor. The fifth circuit may include the second transistor and the fourth transistor.

Another embodiment of the present invention is a semiconductor device including first to fourth transistors, a first capacitor, and a second capacitor. One of a source and a drain of the first transistor is electrically connected to a first terminal. The other of the source and the drain of the first transistor is electrically connected to a gate of the second transistor. A gate of the first transistor is electrically connected to a second terminal. One of a source and a drain of the third transistor is electrically connected to a third terminal. The other of the source and the drain of the third transistor is electrically connected to a gate of the fourth transistor. A gate of the third transistor is electrically connected to a fourth terminal. One of a source and a drain of the second transistor is electrically connected to a fifth terminal. The other of the source and the drain of the second transistor is electrically connected to a seventh terminal. One of a source and a drain of the fourth transistor is electrically connected to a sixth terminal. The other of the source and the drain of the fourth transistor is electrically connected to the seventh terminal. One electrode of the first capacitor is electrically connected to the gate of the second transistor. The other electrode of the first capacitor is electrically connected to the seventh terminal. One electrode of the second capacitor is electrically connected to the gate of the fourth transistor. The other electrode of the second capacitor is electrically connected to the seventh terminal.

The third terminal and the sixth terminal may be electrically connected to each other. Each of the first transistor and the third transistor preferably includes an oxide semiconductor in a semiconductor layer where a channel is formed. In addition, each of the second transistor and the fourth transistor preferably includes an oxide semiconductor in a semiconductor layer where a channel is formed. The oxide semiconductor preferably contains at least one of indium and zinc.

Effect of the Invention

One embodiment of the present invention can provide a semiconductor device capable of holding analog data. Alternatively, a semiconductor device capable of accurately reading analog data held can be provided. Alternatively, a semiconductor device with a reduced occupied area can be provided. Alternatively, a semiconductor device with reduced power consumption can be provided. Alternatively, a semiconductor device with large memory capacity can be provided. Alternatively, a highly reliable semiconductor device can be provided. Alternatively, a novel semiconductor device can be provided.

Note that the effects of one embodiment of the present invention are not limited to the effects listed above. The effects listed above do not preclude the existence of other effects. Note that the other effects are effects that are not described in this section and will be described below. The effects that are not described in this section will be derived from the description of the specification, the drawings, and the like and can be extracted as appropriate from the description by those skilled in the art. Note that one embodiment of the present invention has at least one of the effects listed above and the other effects. Accordingly, one embodiment of the present invention does not have the effects listed above in some cases.

BRIEF DESCRIPTION OF THE DRAWINGS

FIG. 18A is a diagram showing classifications of crystal structures of IGZO, FIG. 18B is a diagram showing an XRD spectrum of crystalline IGZO, and FIG. 18C is a diagram showing a nanobeam electron diffraction pattern of the crystalline IGZO.

MODE FOR CARRYING OUT THE INVENTION

Figure 1A:
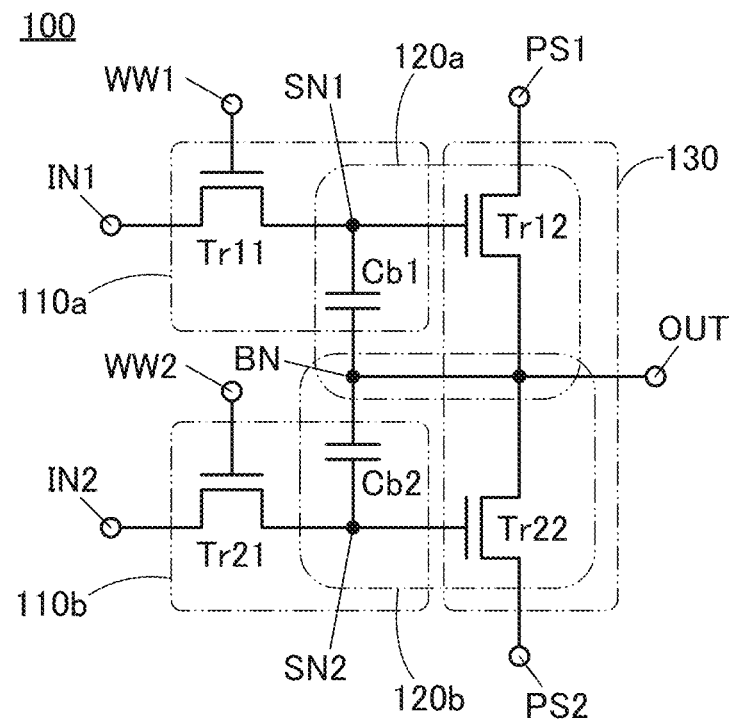
FIG. 1A and FIG. 1B are circuit diagrams of a semiconductor device of one embodiment of the present invention.

Embodiments of the present invention will be described below. Note that one embodiment of the present invention is not limited to the following description, and it will be readily understood by those skilled in the art that modes and details of the present invention can be modified in various ways without departing from the spirit and scope of the present invention. One embodiment of the present invention therefore should not be construed as being limited to the following description of the following embodiments.

In this specification and the like, a semiconductor device refers to a device that utilizes semiconductor characteristics, and means a circuit including a semiconductor element (a transistor, a diode, a photodiode, or the like), a device including the circuit, and the like. In addition, the semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

Furthermore, in the case where this specification and the like state that X and Y are connected, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than that shown in the drawings or the text is regarded as being disclosed in the drawings or the text. Each of X and Y denotes an object (e.g., a device, an element, a circuit, a wiring, an electrode, a terminal, a conductive film, a layer, or the like).

For example, in the case where X and Y are electrically connected, one or more elements that allow electrical connection between X and Y (e.g., a switch, a transistor, a capacitor, an inductor, a resistor, a diode, a display device, a light-emitting device, a load, and the like) can be connected between X and Y. Note that a switch has a function of being controlled to be in an on state or an off state. That is, a switch has a function of being in a conduction state (on state) or a non-conduction state (off state) to control whether or not current flows.

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; a control circuit; or the like) can be connected between X and Y. Note that for example, even when another circuit is sandwiched between X and Y, X and Y are functionally connected when a signal output from X is transmitted to Y.

Note that an explicit description that X and Y are electrically connected includes the case where X and Y are electrically connected (i.e., the case where X and Y are connected with another element or another circuit sandwiched therebetween) and the case where X and Y are directly connected (i.e., the case where X and Y are connected without another element or another circuit sandwiched therebetween).

In addition, it can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order." Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order." Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order." When the connection order in a circuit configuration is defined by using an expression method similar to these examples, a source (or a first terminal or the like) and a drain (or a second terminal or the like) of a transistor can be distinguished from each other to specify the technical scope. Note that these expressions are just examples and expressions are not limited to these expressions. Here, each of X and Y denotes an object (e.g., a device, an element, a circuit, a wiring, an electrode, a terminal, a conductive film, a layer, or the like).

Note that even when a circuit diagram shows that independent components are electrically connected to each other, one component has functions of a plurality of components in some cases. For example, when part of a wiring also functions as an electrode, one conductive film has functions of both components: a function of the wiring and a function of the electrode. Thus, electrical connection in this specification also includes such a case where one conductive film has functions of a plurality of components, in its category.

In addition, in this specification and the like, for a "resistor," a circuit element, a wiring, or the like having a resistance value higher than 0Ω can be used, for example. Therefore, in this specification and the like, a "resistor" includes a wiring having a resistance value, a transistor in which current flows between its source and drain, a diode, a coil, and the like. Thus, the term "resistor" can be replaced with the term such as "resistance," "load," or "region having a resistance value"; inversely, the term "resistance," "load," or "region having a resistance value" can be replaced with the term such as "resistor." The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to $1\times10^9$Ω.

In addition, in this specification and the like, a "capacitor" can be, for example, a circuit element having an electrostatic capacitance value higher than 0 F, a region of a wiring having an electrostatic capacitance value, parasitic capacitance, gate capacitance of a transistor, or the like. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. Furthermore, the term such as "capacitor," "parasitic capacitance," or "gate capacitance" can be replaced with the term such as "capacitance"; inversely, the term "capacitance" can be replaced with the term such as "capacitor," "parasitic capacitance," or "gate capacitance." Moreover, the term "pair of electrodes" of "capacitor" can be replaced with "pair of conductors," "pair of conductive regions," "pair of regions," and the like. Note that the electrostatic capacitance value can be greater than or equal to 0.05 fF and less than or equal to 10 pF, for example. As another example, the electrostatic capacitance value may be greater than or equal to 1 pF and less than or equal to 10 µF.

In addition, in this specification and the like, a transistor includes three terminals called a gate, a source, and a drain. The gate functions as a control terminal for controlling the conduction state of the transistor. Two terminals functioning as the source and the drain are input/output terminals of the transistor. One of the two input/output terminals serves as the source and the other serves as the drain depending on the conductivity type (n-channel type or p-channel type) of the transistor and the levels of potentials applied to the three terminals of the transistor. Thus, the terms "source" and "drain" can be replaced with each other in this specification and the like. Furthermore, in this specification and the like, expressions "one of a source and a drain" (or a first electrode or a first terminal) and "the other of the source and the drain" (or a second electrode or a second terminal) are used in the description of the connection relation of a transistor. Note that depending on the transistor structure, a transistor may include aback gate in addition to the above three terminals. In that case, in this specification and the like, one of the gate and the back gate of the transistor is sometimes referred to as a first gate, and the other of the gate and the back gate of the transistor is sometimes referred to as a second gate. Moreover, the terms "gate" and "back gate" can be replaced with each other in one transistor in some cases. In the case where a transistor includes three or more gates, the gates may be sometimes referred to as a first gate, a second gate, and a third gate, for example, in this specification and the like.

In this specification and the like, in some cases, "on-state current" means a current that flows between a source and a drain when a transistor is in an on state. Furthermore, in some cases, "off-state current" means a current that flows between a source and a drain when a transistor is in an off state.

In addition, in this specification and the like, node can be referred to as a terminal, a wiring, an electrode, a conductive layer, a conductor, an impurity region, or the like depending on a circuit configuration, a device structure, and/or the like. Furthermore, a terminal, a wiring, or the like can be referred to as node.

In addition, in this specification and the like, "voltage" and "potential" can be replaced with each other as appropriate. The "voltage" refers to a potential difference from a reference potential, and when the reference potential is a ground potential, for example, the "voltage" can be replaced with the "potential." Note that the ground potential does not necessarily mean 0 V. Moreover, potentials are relative values, and a potential applied to a wiring, a potential applied to a circuit and the like, and a potential output from a circuit and the like, for example, are changed with a change of the reference potential.

In this specification and the like, a high power supply potential VDD (hereinafter, also simply referred to as "VDD") is a power supply potential higher than a low power supply potential VSS (hereinafter, also simply referred to as "VSS"). VSS refers to a power supply potential at a potential lower than VDD. A ground potential (hereinafter, also simply referred to as "GND") can be used as VDD or VSS. For example, in the case where VDD is a ground potential, VSS is a potential lower than the ground potential, and in the case where VSS is a ground potential, VDD is a potential higher than the ground potential.

"Current" is an electric charge transfer phenomenon (electrical conduction); for example, the description "electrical conduction of positively charged particles occurs" can be rephrased as "electrical conduction of negatively charged particles occurs in an opposite direction." Therefore, unless otherwise specified, "current" in this specification and the like refers to an electric charge transfer phenomenon (electrical conduction) accompanied by carrier movement.

Examples of a carrier here include an electron, a hole, an anion, a cation, a complex ion, and the like, and the carrier differs between current flow systems (e.g., a semiconductor, a metal, an electrolyte solution, a vacuum, and the like). In addition, "direction of current" in a wiring or the like refers to a direction in which a positive carrier moves, and the amount of current is expressed as a positive value. In other words, a direction in which a negative carrier moves is opposite to the direction of current, and the amount of current is expressed as a negative value. Thus, in the case where the polarity of a current (or the direction of current) is not specified in this specification and the like, the description "current flows from element A to element B" can be rephrased as "current flows from element B to element A," for example. Furthermore, the description "current is input to element A" can be rephrased as "current is output from element A," for example.

In addition, ordinal numbers such as "first," "second," and "third" in this specification and the like are used to avoid confusion among components. Thus, the ordinal numbers do not limit the number of components. Furthermore, the ordinal numbers do not limit the order of components. For example, a "first" component in one embodiment in this specification and the like can be referred to as a "second" component in other embodiments, or the scope of claims. Furthermore, a "first" component in one embodiment in this specification and the like can be omitted in other embodiments, or the scope of claims.

The term "over" or "under" does not necessarily mean that a component is placed directly above or directly below and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

The positional relation between components changes as appropriate in accordance with the direction in which each component is described. Thus, the positional relation is not limited to that described with a term in this specification and the like and can be described with another term as appropriate depending on the situation. For example, in this specification and the like, terms for describing arrangement, such as "over" and "under", are sometimes used for convenience to describe the positional relation between components with reference to drawings. Accordingly, the expression "an insulator positioned over (on) a top surface of a conductor" can be replaced with the expression "an insulator positioned under (on) a bottom surface of a conductor" when the direction of a drawing showing these components is rotated by 180°. Moreover, the expression "an insulator positioned over (on) a top surface of a conductor" can be replaced with the expression "an insulator positioned on a left surface (or a right surface) of a conductor" when the direction of a drawing showing these components is rotated by 90°.

Similarly, the term "overlap", for example, in this specification and the like does not limit a state such as the stacking order of components. For example, the expression "electrode B overlapping with insulating layer A" does not necessarily mean the state where "electrode B is formed over insulating layer A", and does not exclude the state where "electrode B is formed under insulating layer A" and the state where "electrode B is formed on the right side (or the left side) of insulating layer A".

The term "adjacent" or "proximity" in this specification and the like does not necessarily mean that a component is directly in contact with another component. For example, the expression "electrode B adjacent to insulating layer A" does not necessarily mean that the electrode B is formed in direct contact with the insulating layer A and does not exclude the case where another component is provided between the insulating layer A and the electrode B.

In addition, in this specification and the like, the terms "film," "layer," and the like can be interchanged with each other depending on the situation. For example, the term "conductive layer" can be changed into the term "conductive film" in some cases. As another example, the term "insulating film" can be changed into the term "insulating layer" in some cases. Alternatively, the term "film," "layer," or the like is not used and can be interchanged with another term depending on the case or the situation. For example, the term "conductive layer" or "conductive film" can be changed into the term "conductor" in some cases. Furthermore, for example, the term "insulating layer" or "insulating film" can be changed into the term "insulator" in some cases.

In addition, in this specification and the like, the term such as "electrode," "wiring," or "terminal" does not limit the function of a component. For example, an "electrode" is used as part of a "wiring" in some cases, and vice versa. Furthermore, the term "electrode" or "wiring" also includes the case where a plurality of "electrodes" or "wirings" are formed in an integrated manner, for example. For example, a "terminal" is used as part of a "wiring" or an "electrode" in some cases, and vice versa. Furthermore, the term "terminal" also includes the case where a plurality of "electrodes," "wirings," "terminals," or the like are formed in an integrated manner, for example. Therefore, for example, an "electrode" can be part of a "wiring" or a "terminal," and a "terminal" can be part of a "wiring" or an "electrode." Moreover, the term such as "electrode," "wiring," or "terminal" is sometimes replaced with the term such as "region."

In addition, in this specification and the like, the term such as "wiring," "signal line," or "power supply line" can be interchanged with each other depending on the case or the situation. For example, the term "wiring" can be changed into the term "signal line" in some cases. Furthermore, for example, the term "wiring" can be changed into the term such as "power source line" in some cases. Inversely, the term such as "signal line" or "power supply line" can be changed into the term "wiring" in some cases. The term such as "power source line" can be changed into the term such as "signal line" in some cases. Inversely, the term such as "signal line" can be changed into the term such as "power source line" in some cases. Moreover, the term "potential" that is applied to a wiring can be sometimes changed into the term such as "signal" depending on the case or the situation. Inversely, the term such as "signal" can be changed into the term "potential" in some cases.

In this specification and the like, an impurity in a semiconductor refers to an element other than a main component of a semiconductor layer, for example. For example, an element with a concentration of lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specifically, there are hydrogen (contained also in water), lithium, sodium, silicon, boron, phosphorus, carbon, nitrogen, and the like, for example. Specifically, in the case where the semiconductor is silicon, examples of an impurity that changes characteristics of the semiconductor include oxygen, Group 1 elements except hydrogen, Group 2 elements, Group 13 elements, Group 15 elements, and the like.

In this specification and the like, a switch has a function of controlling whether current flows or not by being in a conduction state (an on state) or a non-conduction state (an off state). Alternatively, a switch has a function of selecting and changing a current path. For example, an electrical switch, a mechanical switch, or the like can be used. That is, a switch can be any element capable of controlling current, and is not limited to a certain element.

Examples of the electrical switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case where a transistor is used as a switch, a "conduction state (on state)" of the transistor refers to a state where a source and a drain of the transistor can be regarded as being electrically short-circuited. Furthermore, a "non-conduction state (off state)" of the transistor refers to a state where the source and the drain of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification, "parallel" indicates a state where two straight lines are placed at an angle greater than or equal to $-10°$ and less than or equal to $10°$. Accordingly, the case where the angle is greater than or equal to $-5°$ and less than or equal to $5°$ is also included. In addition, "approximately parallel" or "substantially parallel" indicates a state where two straight lines are placed at an angle greater than or equal to $-30°$ and less than or equal to $30°$. In addition, "perpendicular" indicates a state where two straight lines are placed at an angle greater than or equal to $80°$ and less than or equal to $100°$. Accordingly, the case where the angle is greater than or equal to $85°$ and less than or equal to $95°$ is also included. Furthermore, "approximately perpendicular" or "substantially perpendicular" indicates a state where two straight lines are placed at an angle greater than or equal to $60°$ and less than or equal to $120°$.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In addition, in this specification and the like, a metal oxide containing nitrogen is also collectively referred to as a metal oxide in some cases. Furthermore, a metal oxide containing nitrogen may be referred to as a metal oxynitride.

In addition, in this specification and the like, one embodiment of the present invention can be constituted by combining, as appropriate, the structure described in each embodiment with the structures described in the other embodiments. Furthermore, in the case where a plurality of structure examples are described in one embodiment, the structure examples can be combined with each other as appropriate.

Note that content (or may be part of the content) described in one embodiment can be applied to, combined with, or replaced with at least one of another content (or may be part of the content) in the embodiment and content (or may be part of the content) described in one or a plurality of different embodiments.

Note that in each embodiment (or Example), content described in the embodiment is content described using a variety of diagrams or content described with text described in the specification.

Note that by combining a drawing (or may be part thereof) described in one embodiment with at least one of another part of the drawing, a different drawing (or may be part thereof) described in the embodiment, and a drawing (or may be part thereof) described in one or a plurality of different embodiments, much more drawings can be constituted.

Embodiments described in this specification are described with reference to the drawings. Note that the embodiments can be implemented in many different modes, and it will be readily understood by those skilled in the art that the modes and details can be changed in various ways without departing from the spirit and scope thereof. Therefore, the present invention should not be construed as being limited to the description in the embodiments. Note that in the structures of the invention in the embodiments, the same reference numerals are used in common for the same portions or portions having similar functions in different drawings, and repeated description thereof is omitted in some cases. Moreover, some components are omitted in a perspective view, a top view, and the like for easy understanding of the diagrams in some cases.

In this specification and the like, components are classified on the basis of the functions and shown as independent blocks in block diagrams. However, in an actual circuit or the like, it is difficult to separate components on the basis of the functions, and there is such a case where one circuit is associated with a plurality of functions or a case where a plurality of circuits are associated with one function. Therefore, blocks in the block diagrams are not limited by the components described in the specification, and the description can be changed appropriately depending on the situation.

In addition, in the drawings in this specification, the size, the layer thickness, or the region is exaggerated for clarity in some cases. Therefore, embodiments of the present invention are not limited to the size, aspect ratio, and the like shown in the drawings. Note that the drawings schematically show ideal examples, and embodiments of the present invention are not limited to shapes, values, and the like shown in the drawings. For example, variation in signal, voltage, or current due to noise or variation in signal, voltage, or current due to difference in timing can be included.

In this specification and the like, when a plurality of components are denoted with the same reference numerals, and in particular need to be distinguished from each other, an identification sign such as "_1," "[n]," or "[m,n]" is sometimes added to the reference numerals. For example, one of two wirings GL is referred to as a wiring GL[1] and the other is referred to as a wiring GL[2] in some cases.

Embodiment 1

A semiconductor device 100 of one embodiment of the present invention will be described with reference to drawings.

<Structure Example of Semiconductor Device 100>

FIG. 1A is a circuit diagram of the semiconductor device 100 of one embodiment of the present invention. The semiconductor device 100 can function as a memory circuit capable of holding analog data. The semiconductor device 100 can function as a memory element capable of holding analog data. The semiconductor device 100 includes a transistor Tr11, a transistor Tr12, a transistor Tr21, a transistor Tr22, a capacitor Cb1, and a capacitor Cb2.

The semiconductor device 100 further includes a holding circuit 110a, a holding circuit 110b, a bootstrap circuit 120a, a bootstrap circuit 120b, and a source follower circuit 130.

The holding circuit 110a includes the transistor Tr11 and the capacitor Cb1, and the holding circuit 110b includes the transistor Tr21 and the capacitor Cb2. The bootstrap circuit 120a includes the transistor Tr12 and the capacitor Cb1, and the bootstrap circuit 120b includes the transistor Tr22 and the capacitor Cb2. The source follower circuit 130 includes the transistor Tr12 and the transistor Tr22.

A gate of the transistor Tr11 is electrically connected to a terminal WW1, one of a source and a drain of the transistor Tr11 is electrically connected to a terminal IN1, and the other is electrically connected to a gate of the transistor Tr12. One of a source and a drain of the transistor Tr12 is electrically connected to a terminal PS1, and the other is electrically connected to a terminal OUT.

A gate of the transistor Tr21 is electrically connected to a terminal WW2, one of a source and a drain of the transistor Tr21 is electrically connected to a terminal IN2, and the other is electrically connected to a gate of the transistor Tr22. One of a source and a drain of the transistor Tr22 is electrically connected to the terminal OUT, and the other is electrically connected to a terminal PS2.

One electrode of the capacitor Cb1 is electrically connected to the gate of the transistor Tr12, and the other electrode is electrically connected to the terminal OUT. One electrode of the capacitor Cb2 is electrically connected to the terminal OUT, and the other electrode is electrically connected to the gate of the transistor Tr22.

A node at which the other of the source and the drain of the transistor Tr11, the gate of the transistor Tr12, and the one electrode of the capacitor Cb1 are electrically connected functions as a node SN1. A node at which the other of the source and the drain of the transistor Tr21, the gate of the transistor Tr22, and the other electrode of the capacitor Cb2 are electrically connected functions as a node SN2. A node at which the other electrode of the capacitor Cb1, the one electrode of the capacitor Cb2, and the terminal OUT are electrically connected functions as a node BN. Note that each of the node SN1 and the node SN2 functions as a memory node.

The holding circuit 110a has a function of holding a potential (electric charge) written to the node SN1 through the transistor Tr11. The holding circuit 110b has a function of holding a potential (electric charge) written to the node SN2 through the transistor Tr21.

Specifically, a potential for turning on the transistor Tr11 is supplied to the gate of the transistor Tr11, and electric charge for setting the node SN1 to a predetermined potential is supplied to the node SN1 through the source and the drain of the transistor Tr11. Then, a potential for turning off the transistor Tr11 is supplied to the gate of the transistor Tr11. The electric charge written to the node SN1 is held when the transistor Tr11 is turned off.

Similarly, a potential for turning on the transistor Tr21 is supplied to the gate of the transistor Tr21, and electric charge for setting the node SN2 to a predetermined potential is supplied to the node SN2 through the source and the drain of the transistor Tr21. Then, a potential for turning off the transistor Tr21 is supplied to the gate of the transistor Tr21. The electric charge written to the node SN2 is held when the transistor Tr21 is turned off. Therefore, the node SN1 and the node SN2 are also each referred to as a "holding node". The transistor Tr11 and the transistor Tr21 are also each referred to as a "writing transistor."

For semiconductor layers of the transistor Tr11, the transistor Tr12, the transistor Tr21, and the transistor Tr22, a single crystal semiconductor, a polycrystalline semiconductor, a microcrystalline semiconductor, an amorphous semiconductor, or the like can be used alone or in combination. As a semiconductor material, silicon, germanium, or the like can be used. Alternatively, a compound semiconductor such as silicon germanium, silicon carbide, gallium arsenide, an oxide semiconductor, or a nitride semiconductor can be used.

Note that the semiconductor layer used in the transistor may be a stacked layer of a plurality of semiconductor layers. In the case of stacking semiconductor layers, semiconductors having different crystal states may be used or different semiconductor materials may be used.

In particular, each of the transistor Tr11 and the transistor Tr21 is preferably a transistor including an oxide semiconductor in a semiconductor layer where a channel is formed (also referred to as an "OS transistor"). An oxide semiconductor has a band gap of greater than or equal to 2 eV, and thus has extremely low off-state current. When OS transistors are used as the transistor Tr11 and the transistor Tr21, electric charge written to the holding nodes can be held for a long period. The semiconductor device 100 can be referred to as an "OS memory" in the case where OS transistors are used as the transistor Tr11 and the transistor Tr21.

The OS memory can hold data written thereto for one year or longer, or ten years or longer even after power supply is stopped. Hence, the OS memory can be regarded as a nonvolatile memory.

In the OS memory, the amount of written electric charge is less likely to change over a long period of time; hence, the OS memory can hold multilevel (multibit) data as well as binary (1-bit) data.

The OS memory employs a method in which electric charge is written to a node through an OS transistor; hence, high voltage, which a conventional flash memory requires, is unnecessary and high-speed writing operation is possible. The OS memory does not require erasing operation before data rewriting, which is performed in a flash memory. Furthermore, the OS memory does not conduct injection and extraction of electric charge to and from a floating gate or a charge-trap layer, substantially allowing an unlimited number of times of data writing and reading. The OS memory is less likely to degrade than a conventional flash memory and can have high reliability.

Unlike a magneto-resistive memory (MRAM), a resistance-change memory (ReRAM), and the like, the OS memory does not undergo a structure change at the atomic level. Hence, the OS memory has higher rewrite endurance than the magneto-resistive memory and the resistance-change memory.

The off-state current of the OS transistor hardly increases even in a high-temperature environment. Specifically, the off-state current hardly increases even at an environment temperature ranging from room temperature to 200° C. Furthermore, the on-state current is less likely to decrease even in the high-temperature environment. A memory device including the OS memory achieves stable operation and high reliability even in a high-temperature environment. Moreover, the OS transistor has high breakdown voltage between its source and drain. When OS transistors are used as transistors included in a semiconductor device, the semiconductor device achieves stable operation and high reliability even in a high temperature environment. Thus, OS transistors are preferably used as the transistor Tr11, the transistor Tr21, the transistor Tr12, and the transistor Tr22.

When gate insulating films of the transistor Tr12 and the transistor Tr22 are extremely thin, electric charge written to the node SN1 and the node SN2 through the gate insulating films leaks (also referred to as "gate leakage") in some cases. It is preferable that the thickness of the gate insulating film of each of the transistor Tr12 and the transistor Tr22 be approximately the same as the thickness of the gate insulating film of each of the transistor Tr11 and the transistor Tr21.

Alternatively, OS transistors may be used as the transistor Tr11 and the transistor Tr21 and Si transistors may be used as the transistor Tr12 and the transistor Tr22, for example. As the Si transistors used as the transistor Tr12 and the transistor Tr22, Si transistors with a small amount of gate leakage may be employed.

Since a Si transistor has a higher operation speed than an OS transistor, the use of Si transistors as the transistor Tr12 and the transistor Tr22 can increase the data reading speed.

Figure 1B:
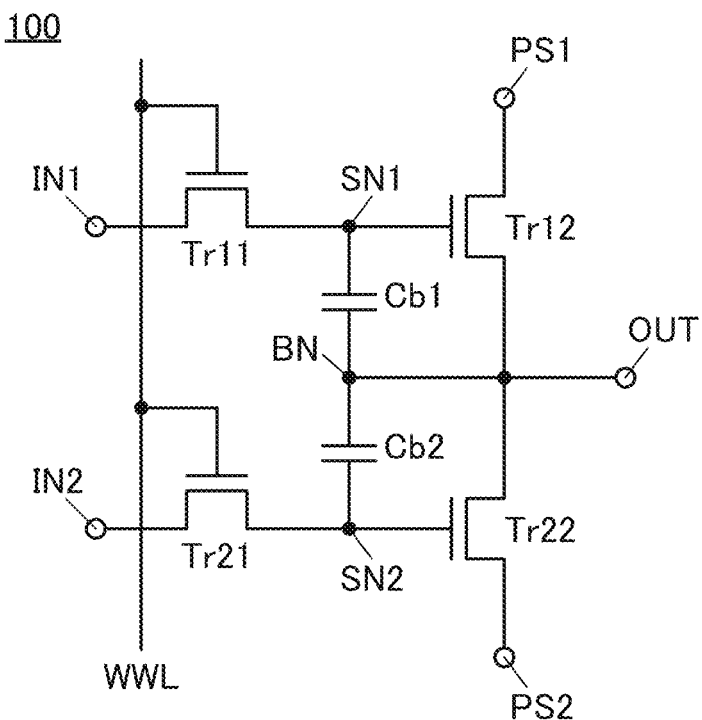

As illustrated in FIG. 1B, the gate of the transistor Tr11 and the gate of the transistor Tr21 may be electrically connected to a wiring WWL.

Figure 2A:
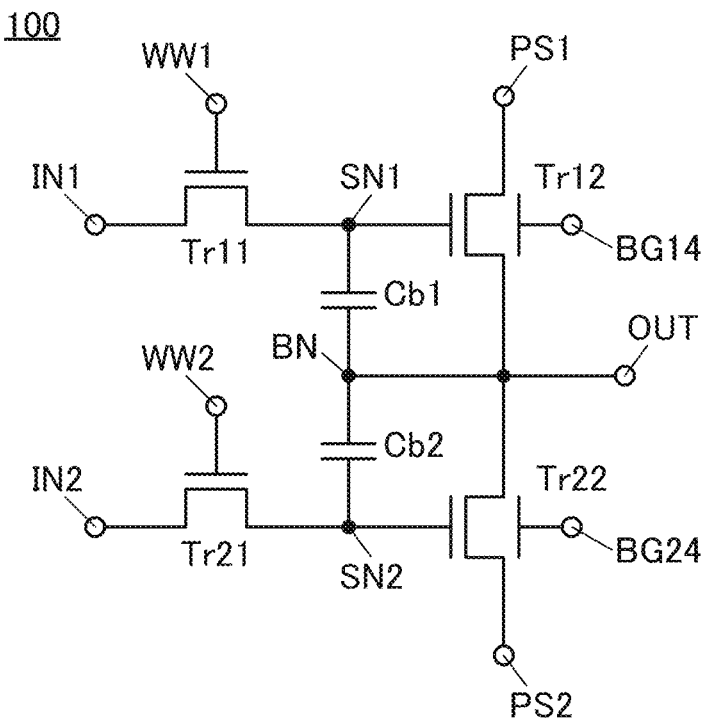
FIG. 2A and FIG. 2B are circuit diagrams of a semiconductor device of one embodiment of the present invention.

As illustrated in FIG. 2A, a transistor having a back gate may be used as each of the transistor Tr12 and the transistor Tr22. FIG. 2A illustrates an example in which a back gate of the transistor Tr12 is electrically connected to a terminal BG14 and a back gate of the transistor Tr22 is electrically connected to a terminal BG24. The threshold voltage of the transistor Tr12 can be changed by controlling the potential of the terminal BG14. The threshold voltage of the transistor Tr22 can be changed by controlling the potential of the terminal BG24.

Figure 2B:
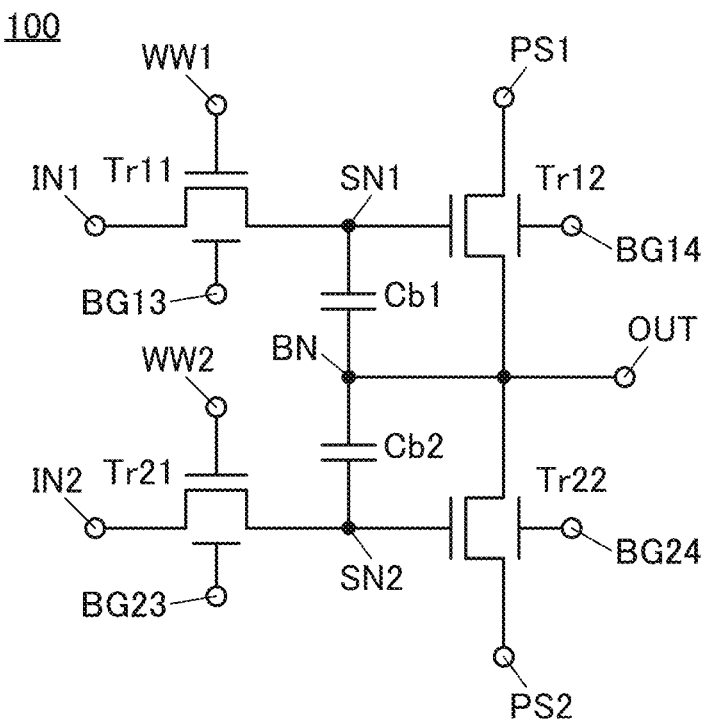

As illustrated in FIG. 2B, a transistor having a back gate may be used as each of the transistor Tr11 and the transistor Tr21. FIG. 2B illustrates an example in which a back gate of the transistor Tr11 is electrically connected to a terminal BG13 and a back gate of the transistor Tr21 is electrically connected to a terminal BG23. The threshold voltage of the transistor Tr11 can be changed by controlling the potential of the terminal BG13. The threshold voltage of the transistor Tr21 can be changed by controlling the potential of the terminal BG23.

Figure 3A:
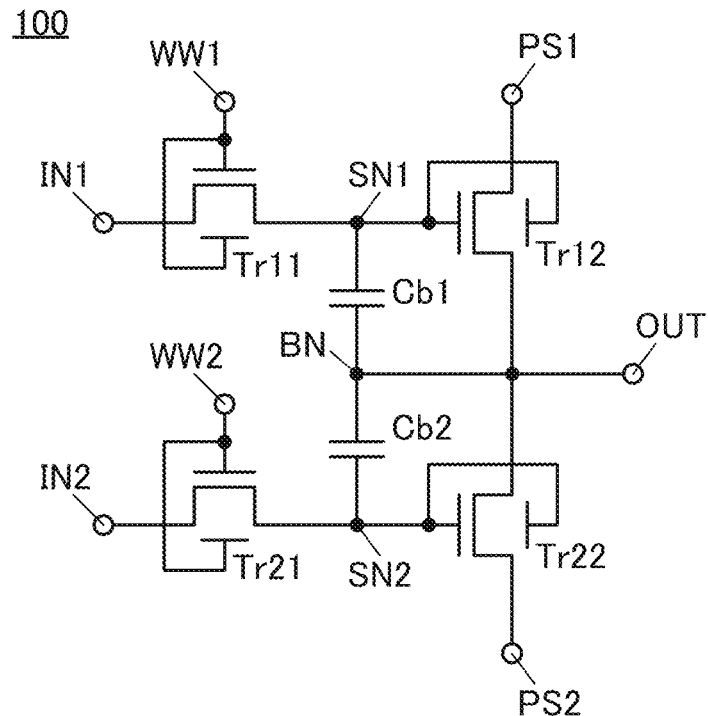
FIG. 3A and FIG. 3B are circuit diagrams of a semiconductor device of one embodiment of the present invention.
Figure 3B:
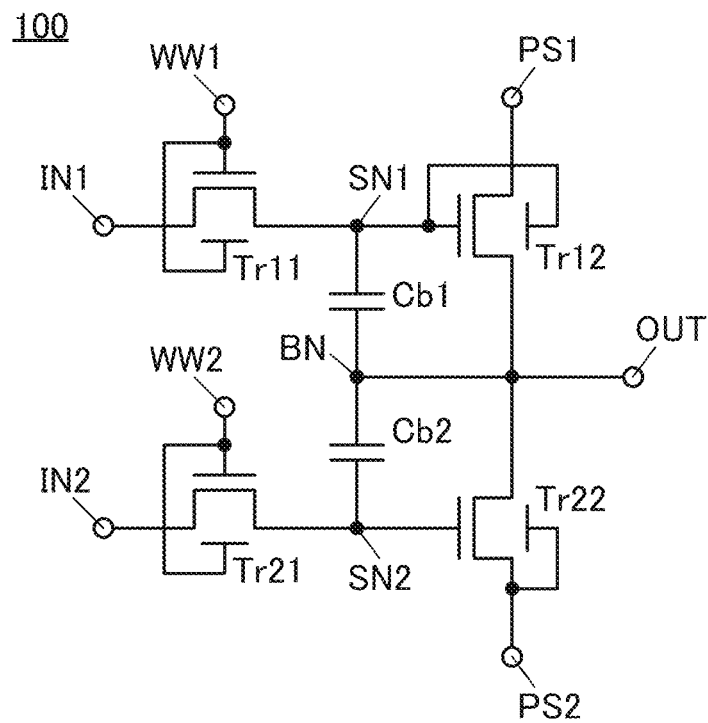

FIG. 3A illustrates an example in which a gate and a back gate are electrically connected to each other in each of the transistor Tr11, the transistor Tr12, the transistor Tr21, and the transistor Tr22. FIG. 3B illustrates an example in which the back gate of the transistor Tr22 is electrically connected to the other of the source and the drain of the transistor Tr22. By providing the back gate, an electric field generated outside the transistor is less likely to affect a channel formation region; thus, operation of the semiconductor device is stabilized and the reliability of the semiconductor device can be increased.

Figure 4A:
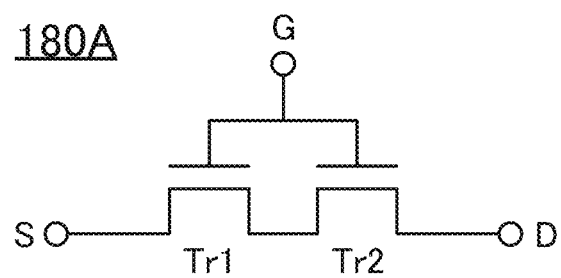
FIG. 4A and FIG. 4B are diagrams showing circuit symbols of transistors.

Each of the transistor Tr11, the transistor Tr12, the transistor Tr21, and the transistor Tr22 may be a double-gate transistor. FIG. 4A illustrates a circuit symbol example of a double-gate transistor 180A.

The transistor 180A has a structure in which a transistor Tr1 and a transistor Tr2 are connected in series. FIG. 4A illustrates a state in which one of a source and a drain of the transistor Tr1 is electrically connected to a terminal S, the other of the source and the drain of the transistor Tr1 is electrically connected to one of a source and a drain of the transistor Tr2, and the other of the source and the drain of the transistor Tr2 is electrically connected to a terminal D. FIG. 4A illustrates a state in which gates of the transistor Tr1 and the transistor Tr2 are electrically connected to each other and electrically connected to a terminal G.

The transistor 180A illustrated in FIG. 4A has a function of switching a conduction state and a non-conduction state between the terminal S and the terminal D by changing the potential of the terminal G. Thus, the transistor 180A which is a double-gate transistor functions as one transistor including the transistor Tr1 and the transistor Tr2. In other words, it can be said that in FIG. 4A, one of a source and a drain of the transistor 180A is electrically connected to the terminal S, the other of the source and the drain thereof is electrically connected to the terminal D, and a gate thereof is electrically connected to the terminal G.

Figure 4B:
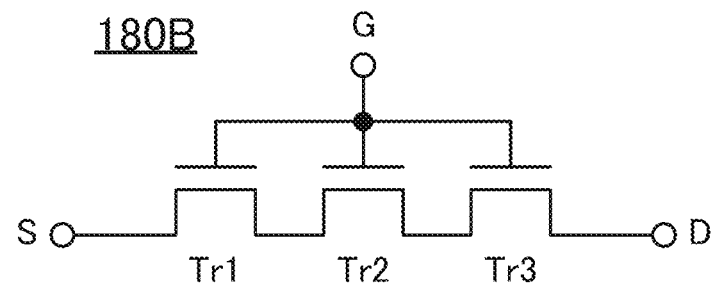

Each of the transistor Tr11, the transistor Tr12, the transistor Tr21, and the transistor Tr22 may be a triple-gate transistor. FIG. 4B illustrates a circuit symbol example of a triple-gate transistor 180B.

The transistor 180B has a structure in which the transistor Tr1, the transistor Tr2, and a transistor Tr3 are connected in series. FIG. 4B illustrates a state where the one of the source and the drain of the transistor Tr1 is electrically connected to the terminal S, the other of the source and the drain of the transistor Tr1 is electrically connected to the one of the source and the drain of the transistor Tr2, the other of the source and the drain of the transistor Tr2 is electrically connected to one of a source and a drain of the transistor Tr3, and the other of the source and the drain of the transistor Tr3 is electrically connected to the terminal D. FIG. 4B illustrates a state in which gates of the transistor Tr1, the transistor Tr2, and the transistor Tr3 are electrically connected to each other and electrically connected to the terminal G.

The transistor 180B illustrated in FIG. 4B has a function of switching a conduction state and a non-conduction state between the terminal S and the terminal D by changing the potential of the terminal G. Thus, the transistor 180B which is a triple-gate transistor functions as one transistor including the transistor Tr1, the transistor Tr2, and the transistor Tr3. In other words, it can be said that in FIG. 4B, one of a source and a drain of the transistor 180B is electrically connected to the terminal S, the other of the source and the drain thereof is electrically connected to the terminal D, and a gate thereof is electrically connected to the terminal G.

Like the transistor 180A and the transistor 180B, a transistor including a plurality of gates electrically connected to each other is referred to as a "multi-gate type transistor" or a "multi-gate transistor" in some cases.

<Operation Example of Semiconductor Device 100>

An operation example of the semiconductor device 100 will be described with reference to drawings. As described above, the semiconductor device 100 of one embodiment of the present invention forms the source follower circuit 130 with use of the transistor Tr12 and the transistor Tr22.

Figure 5A:
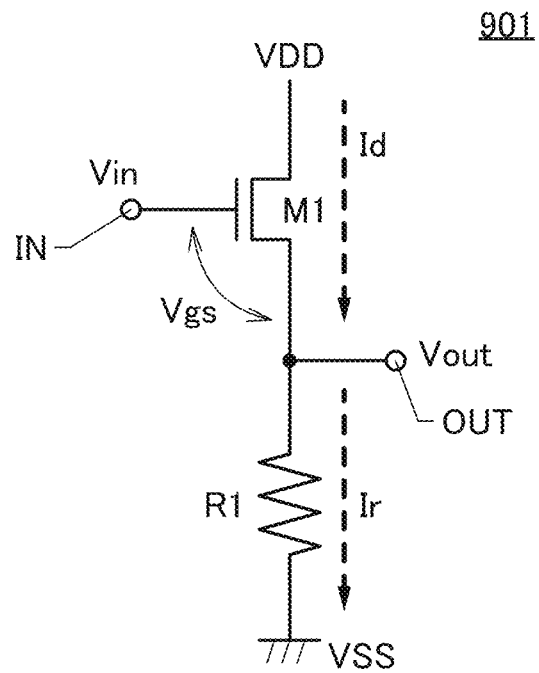
FIG. 5A and FIG. 5B are diagrams each illustrating a source follower circuit.

Here, a source follower circuit is described. FIG. 5A is a circuit diagram of a source follower circuit 901 including a transistor M1 and a resistor R1. The transistor M1 is an n-channel transistor. In the source follower circuit 901 illustrated in FIG. 5A, a source of the transistor M1 is electrically connected to one terminal of the resistor R1. Furthermore, VDD is supplied to a drain of the transistor M1, and VSS is supplied to the other terminal of the resistor. A gate of the transistor M1 is electrically connected to a terminal IN, and an input voltage Vin is input through the terminal IN. The source of the transistor M1 is electrically connected to the terminal OUT, and an output voltage Vout is output through the terminal OUT.

A transistor included in the source follower circuit needs to be operated in a saturation region. Accordingly, when the threshold voltage of the transistor M1 is Vth, the transistor M1 needs to be operated under conditions that satisfy Expression 1.

[Expression 1]

$$VDD > Vin - Vth \quad (1)$$

Next, the operation of the source follower circuit 901 is described. Since the output voltage Vout is a source voltage of the transistor M1, the output voltage Vout is constantly approximately a voltage obtained by subtracting Vth from Vin. More accurately, the output voltage Vout changes to satisfy Expression 2.

[Expression 2]

$$Vout = \frac{1}{2}\mu_n C_{ox}\frac{W}{L}(Vin - Vth - Vout)^2 R1 \quad (2)$$

In Expression 2, $\mu_n$ is mobility, Cox is a gate capacitance, W is a channel width, L is a channel length, Vin is a voltage input through the terminal IN (a gate voltage of the transistor M1), Vth is the threshold voltage of the transistor M1, and R1 is a resistance value of the resistor R1.

In the source follower circuit 901, when the input voltage Vin changes, the output voltage Vout changes in accordance with the change in the input voltage Vin.

Next, the case where the input voltage Vin is constant and the input impedance of a load connected to the terminal OUT changes is considered. A current flowing between the source and the drain of the transistor M1 is Id, a current flowing through the resistor R1 is Ir, and a voltage between the gate and the source (the gate voltage) of the transistor M1 is Vgs.

In the case where the load is not connected to the terminal OUT, Id and Ir are equal to each other. When the load is connected to the terminal OUT and the input impedance of the load decreases, part of Id is supplied to the load, so that the amount of Ir is reduced. Then, voltage generated in the resistor R1 is decreased. That is, Vout decreases.

The decrease in Vout means a reduction in the source potential of the transistor M1. Thus, Vgs increases and Id increases. The increase in Id continues until Vout=Vin−Vth is roughly established. More accurately, the output voltage Vout increases until Expression 2 is satisfied.

When the input impedance of the load connected to the terminal OUT increases, the amount of current supplied to the load side decreases, and thus the amount of Ir flowing through the resistor R1 increases. Thus, voltage generated in the resistor R1 increases. That is, Vout increases.

The increase in Vout means an increase in the source potential of the transistor M1. Thus, Vgs decreases and Id decreases. The decrease in Id continues until Vout=Vin−Vth is roughly established. More accurately, the output voltage Vout decreases until Expression 2 is satisfied.

As described above, the source follower circuit has a function of always supplying a constant voltage even when the input impedance of the load changes. That is, the source follower circuit has a function of executing power amplification (amplifying a current value without changing an output voltage).

Figure 5B:
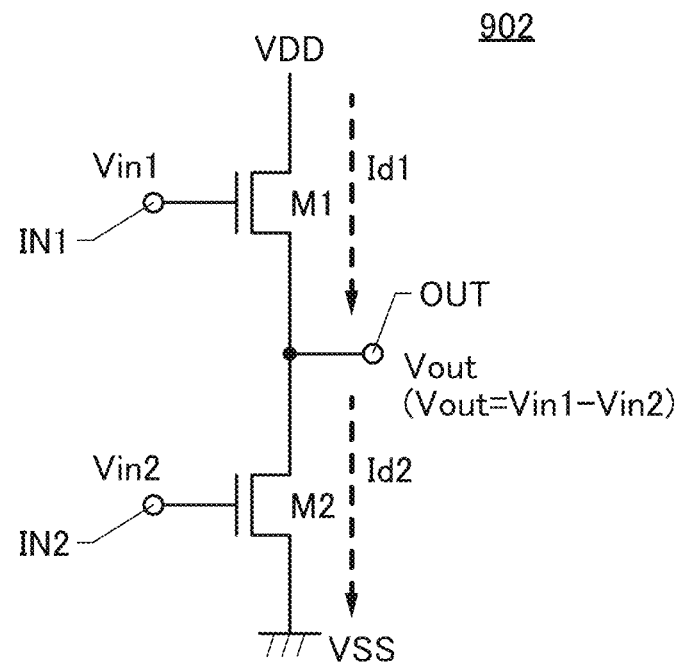

As in a source follower circuit 902 illustrated in FIG. 5B, the resistor R1 in the source follower circuit 901 can be replaced with a transistor M2. The transistor M2 is an n-channel transistor. Also in the source follower circuit 902, the transistor M1 and the transistor M2 operate in a saturation region.

In the source follower circuit 902, the gate of the transistor M1 is electrically connected to the terminal IN1, and a gate of the transistor M2 is electrically connected to the terminal IN2. A drain of the transistor M2 is electrically connected to the terminal OUT. A source of the transistor M2 is supplied with a low power supply voltage VSS.

The source follower circuit 902 also has a function of executing power amplification. In the source follower circuit 902, when a current flowing between the source and the drain of the transistor M1 that operates in the saturation region is Id1, a current flowing between the source and the drain of the transistor M2 that operates in the saturation region is Id2, Id1 can be expressed by Expression 3 and Id2 can be expressed by Expression 4.

[Expression 3]

$$Id1 = \frac{1}{2}\mu_n C_{ox} \frac{W}{L}(Vin1 - Vout - Vth1)^2 \quad (3)$$

In Expression 3, $\mu_n$ is mobility, Cox is a gate capacitance, W is a channel width, L is a channel length, Vin1 is a voltage input through the terminal IN1 (a gate voltage of the transistor M1), and Vth1 is the threshold voltage of the transistor M1.

[Expression 4]

$$Id2 = \frac{1}{2}nC_{ox}\frac{W}{L}(Vin2 - Vth2)^2 \quad (4)$$

In Expression 4, $\mu_n$ is mobility, Cox is a gate capacitance, W is a channel width, L is a channel length, Vin2 is a voltage input through the terminal IN2 (a gate voltage of the transistor M2), and Vth2 is the threshold voltage of the transistor M2.

In the source follower circuit 902, Id1 and Id2 are equal to each other. In addition, when the transistor M1 and the transistor M2 have the same structure and the same transistor characteristics, the output voltage Vout in the source follower circuit 902 can be expressed by Expression 5.

[Expression 5]

$$Vout=Vin1-Vin2 \quad (5)$$

Figure 6:
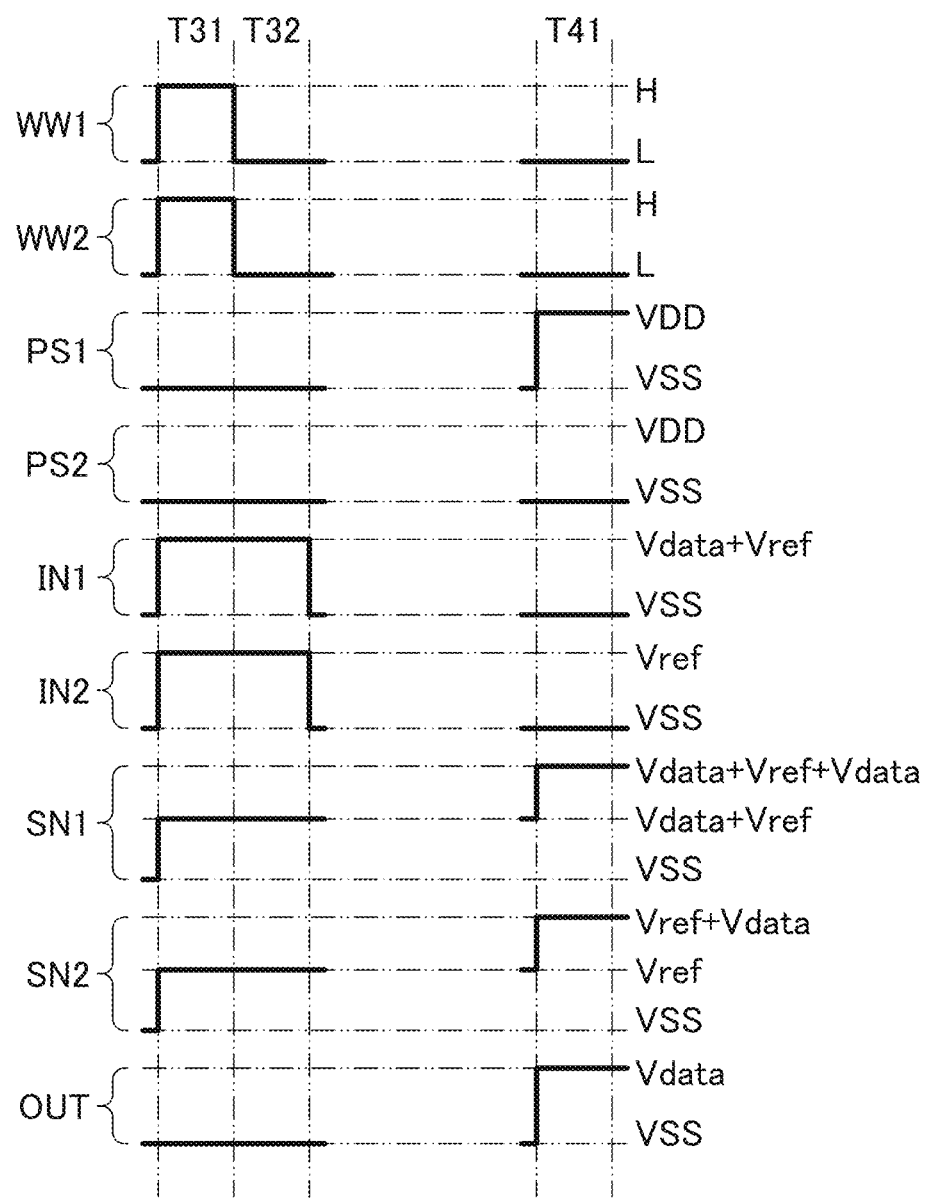
FIG. 6 is a timing chart showing an operation example of a semiconductor device.

The description of the operation example of the semiconductor device 100 will be continued below. FIG. 6 is a timing chart showing operation of the semiconductor device 100. FIG. 7 and FIG. 8 are diagrams illustrating operation states of the semiconductor device 100.

In the drawings and the like, a symbol showing a potential (also referred to as a "potential symbol") such as "VDD" or "VSS" is sometimes illustrated adjacent to a terminal, a wiring, or the like. For easy understanding of changes in potentials of terminals, wirings, and the like, a potential symbol of a terminal, a wiring, or the like whose potential has changed is sometimes enclosed. Furthermore, a symbol "×" sometimes overlaps an off-state transistor.

[Data Writing Operation]

Before data writing operation starts, each of potentials of the terminal WW1 and the terminal WW2 is an L potential, and each of potentials of the terminal PS1, the terminal PS2, the terminal IN1, the terminal IN2, the node SN1, the node SN2, and the terminal OUT is VSS. Note that in this specification and the like, a potential that can turn off a transistor is referred to as an L potential. The L potential may be, for example, VSS, but does not mean a particular potential. Also in this specification and the like, a potential that can turn on a transistor is referred to as an H potential. The H potential may be, for example, VDD, but does not mean a particular potential.

For example, in the case of description "L potential is supplied" to each of two wirings, the L potentials supplied to the two wirings are not necessarily equal to each other. Similarly, in the case of description "H potential is supplied" to each of two wirings, the H potentials supplied to the two wirings are not necessarily equal to each other.

Figure 7A:
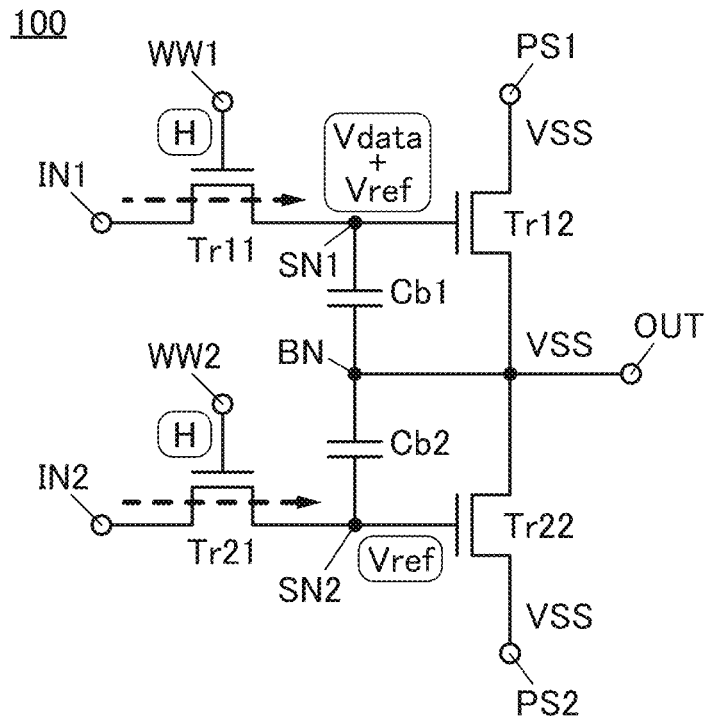
FIG. 7A and FIG. 7B are diagrams illustrating operation examples of a semiconductor device.

In a period T31, the H potential is supplied to the terminal WW1 and the terminal WW2 to turn on the transistor Tr11 and the transistor Tr21 (see FIG. 7A). A voltage (Vdata+Vref) obtained by adding a reference voltage Vref (a reference potential) to data Vdata is supplied to the node SN1 through the terminal IN1 and the transistor Tr11.

The reference voltage Vref is supplied as Vin2 to the node SN2 through the terminal IN2 and the transistor Tr21. Since the transistor Tr22 needs to operate in the saturation region at the time of reading operation, the reference voltage Vref is preferably lower than or equal to the threshold voltage Vth2 of the transistor Tr22. Note that in the case where the transistor Tr12 and the transistor Tr22 have the same transistor characteristics, Vref=Vth1=Vth2.

Figure 7B:
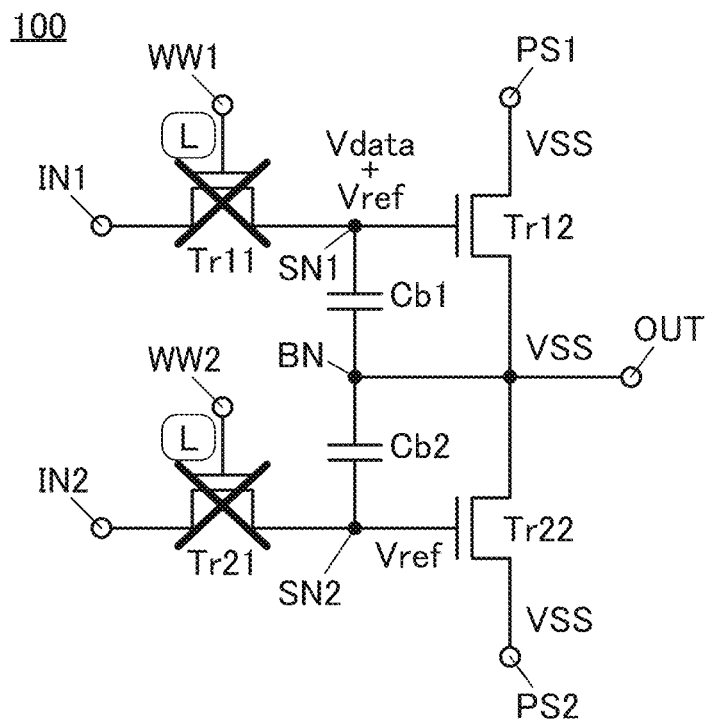

In a period T32, the L potential is supplied to the terminal WW1 and the terminal WW2 to turn off the transistor Tr11 and the transistor Tr21 (see FIG. 7B). When the transistor Tr11 is turned off, the node SN1 is brought into a floating state and the potential (electric charge) in the node SN1 is held. When the transistor Tr21 is turned off, the node SN2 is brought into a floating state and the potential (electric charge) in the node SN2 is held.

[Data Reading Operation]

Figure 8A:
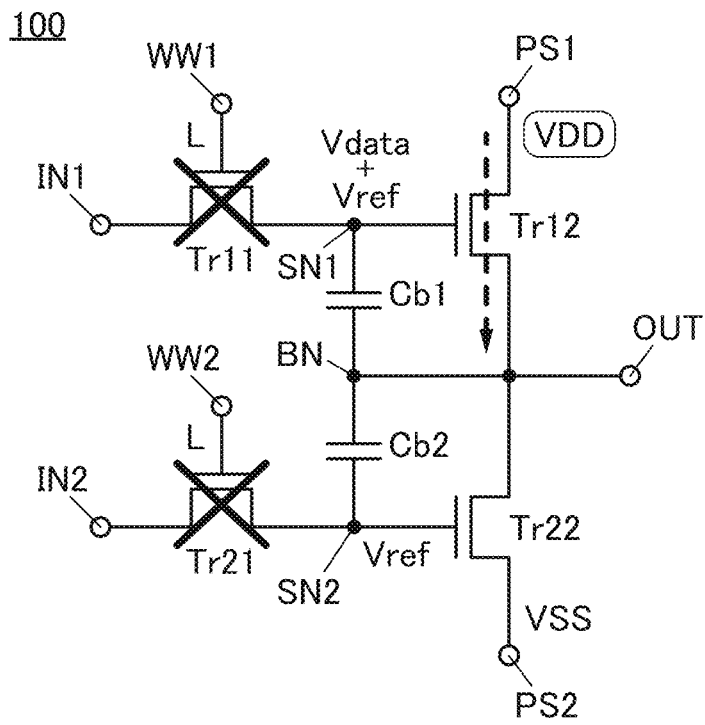
FIG. 8A and FIG. 8B are diagrams illustrating operation examples of a semiconductor device.
Figure 8B:
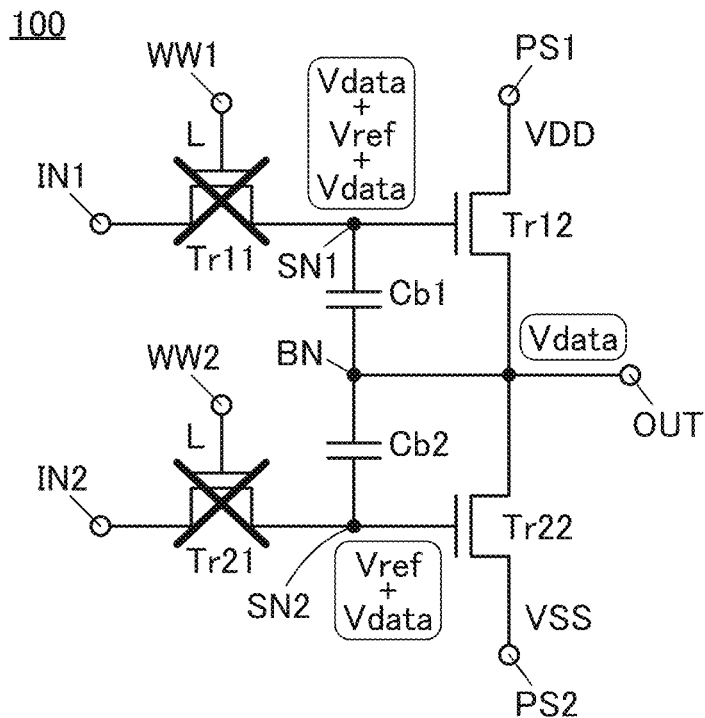

In a period T41, VDD is supplied to the terminal PS1. Consequently, a current flows from the terminal PS1 through the transistor Tr12, so that electric charge is supplied to the node BN. FIG. 8A illustrates a state immediately after the period T41 starts.

The supply of electric charge to the node BN increases the potential of the node BN. The node SN1 is in the floating state in the period T41 and forms capacitive coupling with the node BN through the capacitor Cb1; thus, the potential of the node SN1 (also referred to as "Vsn1") also increases by the bootstrap effect. Similarly, the node SN2 is in the floating state in the period T41 and the node SN2 forms capacitive coupling with the node BN through the capacitor Cb2; thus, the potential of the node SN2 (also referred to as "Vsn2") also increases by the bootstrap effect (see FIG. 8B).

As described above, the semiconductor device 100 includes the bootstrap circuit 120a including the transistor Tr12 and the capacitor Cb1. The bootstrap circuit 120a has a function of increasing the potential of the node SN1. Furthermore, the semiconductor device 100 includes the bootstrap circuit 120b including the transistor Tr22 and the capacitor Cb2. The bootstrap circuit 120b has a function of increasing the potential of the node SN2.

In the semiconductor device 100, the potential of the node BN can be rephrased as the output voltage Vout. The potential of the node BN (the output voltage Vout) corresponds to a potential difference between the node SN1 and the node SN2. The potential of the node BN (the output voltage Vout) changes until Expression 5 shown above is satisfied. Specifically, the potential of the node BN changes until becoming Vsn1-Vsn2. Thus, the potential of the node BN (the output voltage Vout) finally becomes Vdata.

At this time, it can be said that the transistor Tr22 operates in the saturation region. In order to make the transistor Tr12 operate in the saturation region, the potential Vin1 supplied to the terminal IN1 at the time of writing operation needs to satisfy Expression 6.

[Expression 6]
$$Vth1 \le Vin1 \le \frac{1}{2}VVD + Vth1 \quad (6)$$

Figure 9:
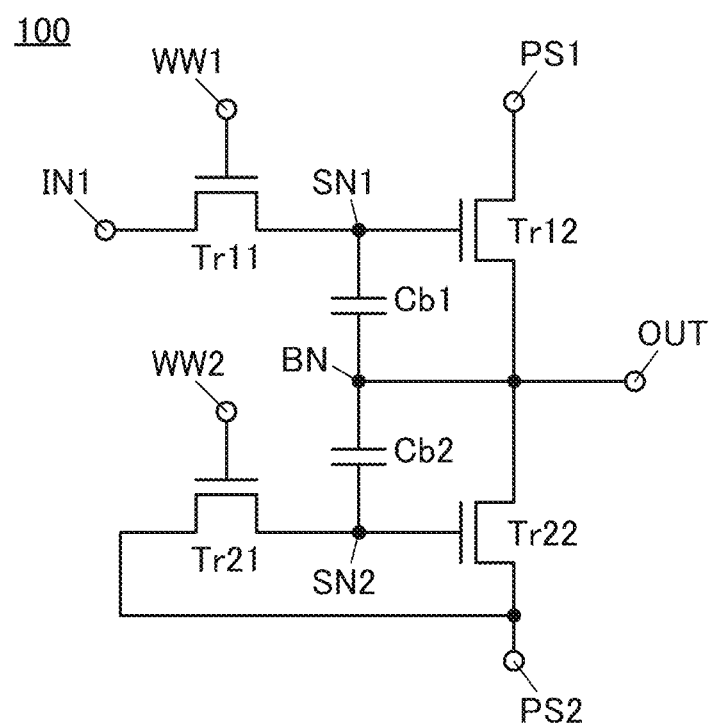
FIG. 9 is a circuit diagram of a semiconductor device of one embodiment of the present invention.

When the potential supplied to the terminal IN2 is set to VSS, Vin1=Vdata can be established. For example, as illustrated in FIG. 9, the one of the source and the drain of the transistor Tr21 electrically connected to the terminal IN2 may be electrically connected to the terminal PS2, not to the terminal IN2. When the potential supplied to the terminal IN2 is set to VSS, Vref does not need to be added to Vin1, whereby a driver circuit in the semiconductor device 100 can be small. Thus, the area occupied by a semiconductor device including the semiconductor device 100 can be reduced. The flexibility of designing a semiconductor device is improved. Furthermore, the reliability of the semiconductor device can be improved.

When the potential supplied to the terminal IN2 is set to VSS, Vdata needs to satisfy Expression 7.

[Expression 7]
$$Vth1 \le Vdata \le \frac{1}{2}(VDD + Vth1) \quad (7)$$

As described above, the semiconductor device 100 of one embodiment of the present invention has a function of holding analog data and a function of amplifying the electric power of the analog data held and outputting the data. Since the electric power of data held is amplified at the time of reading, a power amplifier circuit or the like used after the data reading can be unnecessary. Alternatively, the number of power amplifier circuits or the scale thereof can be reduced.

The semiconductor device 100 of one embodiment of the present invention can stably output (read) data held even when the impedance of the load connected to the output terminal (the terminal OUT) changes. Note that the semiconductor device 100 of one embodiment of the present invention can hold not only analog data but also digital data.

This embodiment can be combined as appropriate with any of the other embodiments and the like described in this specification.

Embodiment 2

In this embodiment, a semiconductor device 400 including a memory device or a semiconductor device of one embodiment of the present invention is described.

Figure 10A:
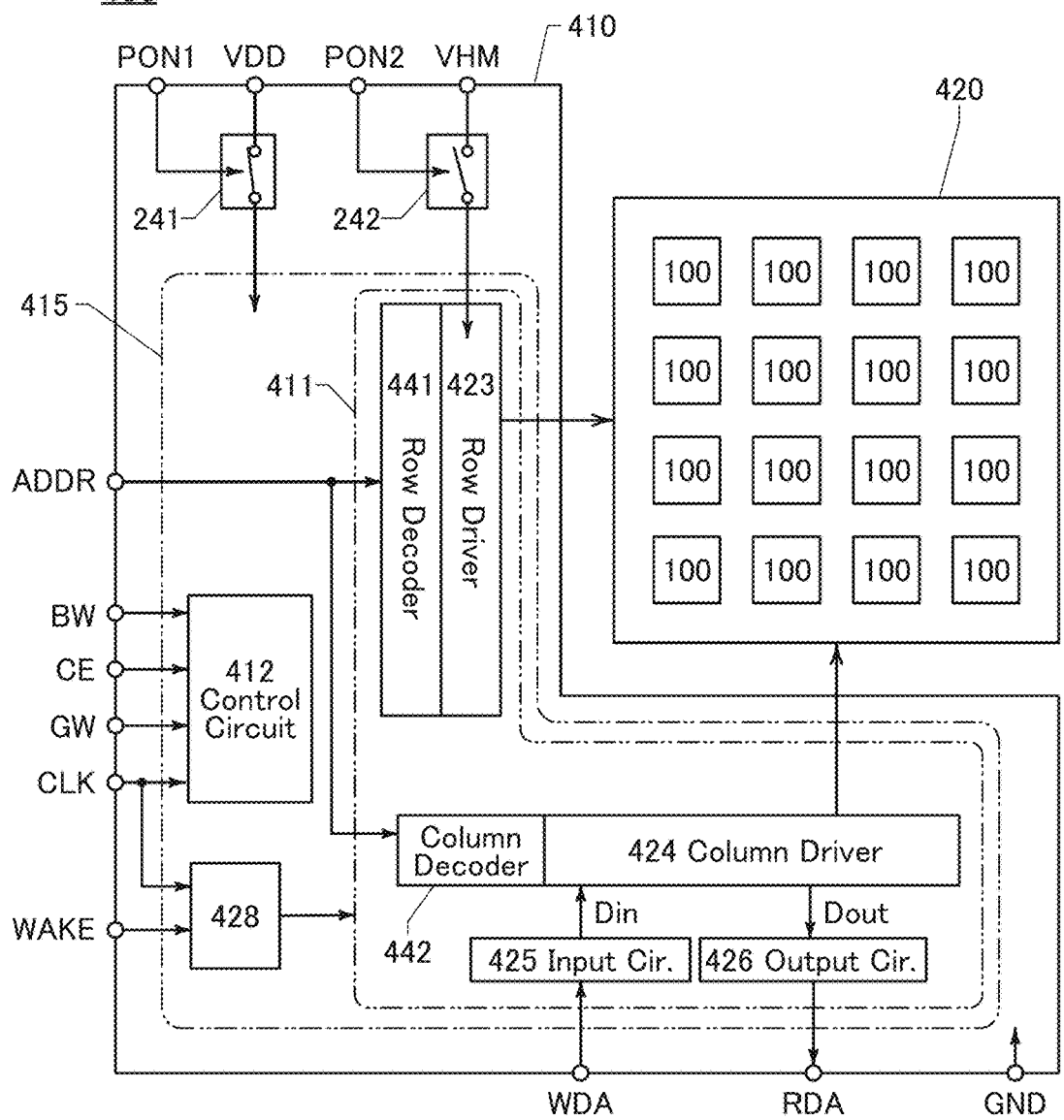
FIG. 10A is a block diagram illustrating a structure example of a semiconductor device.

FIG. 10A is a block diagram illustrating a structure example of the semiconductor device 400. The semiconductor device 400 illustrated in FIG. 10A includes a driver circuit 410 and a memory array 420. The memory array 420 includes a plurality of semiconductor devices 100. The semiconductor device 100 functions as a memory cell. FIG. 10A illustrates an example in which the memory array 420 includes the plurality of semiconductor devices 100 arranged in a matrix.

The driver circuit 410 includes a PSW 241 (a power switch), a PSW 242, and a peripheral circuit 415. The peripheral circuit 415 includes a peripheral circuit 411, a control circuit 412, and a voltage generation circuit 428.

In the semiconductor device 400, each circuit, each signal, and each voltage can be appropriately selected as needed. Alternatively, another circuit or another signal may be added. Signals BW, CE, GW, CLK, WAKE, ADDR, WDA, PON1, and PON2 are signals input from the outside, and a signal RDA is a signal output to the outside. The signal CLK is a clock signal.

In addition, the signals BW and CE and the signal GW are control signals. The signal CE is a chip enable signal, the signal GW is a global write enable signal, and the signal BW is a byte write enable signal. The signal ADDR is an address signal. The signal WDA is write data, and the signal RDA is read data. The signals PON1 and PON2 are power gating control signals. Note that the signals PON1 and PON2 may be generated in the control circuit 412.

The control circuit 412 is a logic circuit having a function of controlling the overall operation of the semiconductor device 400. For example, the control circuit performs logical operation on the signal CE, the signal GW, and the signal BW to determine an operation mode of the semiconductor device 400 (e.g., write operation or read operation). Alternatively, the control circuit 412 generates a control signal for the peripheral circuit 411 so that the operation mode is executed.

The voltage generation circuit 428 has a function of generating negative voltage. WAKE has a function of controlling the input of CLK to the voltage generation circuit 428. For example, when an H-level signal is supplied as WAKE, the signal CLK is input to the voltage generation circuit 428, and the voltage generation circuit 428 generates negative voltage.

The peripheral circuit 411 is a circuit for writing and reading data to/from the semiconductor device 100. The peripheral circuit 411 includes a row decoder 441 (Row Decoder), a column decoder 442 (Column Decoder), a row driver 423 (Row Driver), a column driver 424 (Column Driver), an input circuit 425 (Input Cir.), and an output circuit 426 (Output Cir.). In addition, a sense amplifier or the like may be provided as necessary.

The row decoder 441 and the column decoder 442 have a function of decoding the signal ADDR. The row decoder 441 is a circuit for specifying a row to be accessed, and the column decoder 442 is a circuit for specifying a column to be accessed. The row driver 423 has a function of selecting the wiring specified by the row decoder 441. The column driver 424 has a function of writing data to the semiconductor device 100, a function of reading data from the semiconductor device 100, a function of holding the read data, and the like.

The input circuit 425 has a function of holding the signal WDA. Data held by the input circuit 425 is output to the column driver 424. Data output from the input circuit 425 is data (Din) to be written to the semiconductor device 100. Data (Dout) read from the semiconductor device 100 by the column driver 424 is output to the output circuit 426. The output circuit 426 has a function of holding Dout. In addition, the output circuit 426 has a function of outputting Dout to the outside of the semiconductor device 400. Data output from the output circuit 426 is the signal RDA.

The PSW 241 has a function of controlling the supply of VDD to the peripheral circuit 415. The PSW 242 has a function of controlling the supply of VHM to the row driver 423. Here, in the semiconductor device 400, high power supply voltage is VDD and low power supply voltage is GND (a ground potential). In addition, VHM is high power supply voltage used to set a word line at a high level and is higher than VDD. The on/off of the PSW 241 is controlled by the signal PON1, and the on/off of the PSW 242 is controlled by the signal PON2. The number of power domains to which VDD is supplied is one in the peripheral circuit 415 in FIG. 10A but can be plural. In this case, a power switch is provided for each power domain.

Figure 10B:
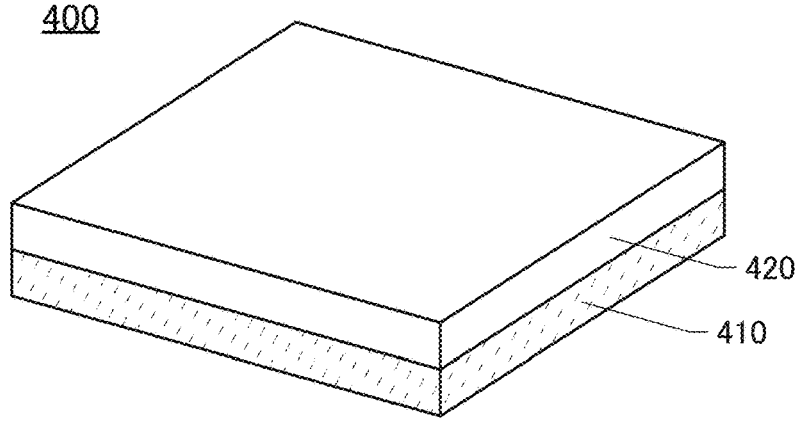
FIG. 10B is a perspective view of the semiconductor device.

The driver circuit 410 and the memory array 420 that are included in the semiconductor device 400 may be provided on the same plane. In addition, as illustrated in FIG. 10B, the driver circuit 410 and the memory array 420 may be provided to overlap with each other. When the driver circuit 410 and the memory array 420 are provided to overlap with each other, the signal transmission distance can be shortened.

In addition, in the semiconductor device 400, an arithmetic processing unit such as a CPU (Central Processing Unit) or a GPU (Graphics Processing Unit) may be used for the control circuit 412 included in the driver circuit 410. With the use of the CPU and/or the GPU or the like, the semiconductor device 400 that has an arithmetic processing function can be achieved.

This embodiment can be combined as appropriate with any of the other embodiments and the like described in this specification.

Embodiment 3

An example of an arithmetic processing unit that can include the semiconductor device described in the above embodiment is described in this embodiment.

Figure 11:
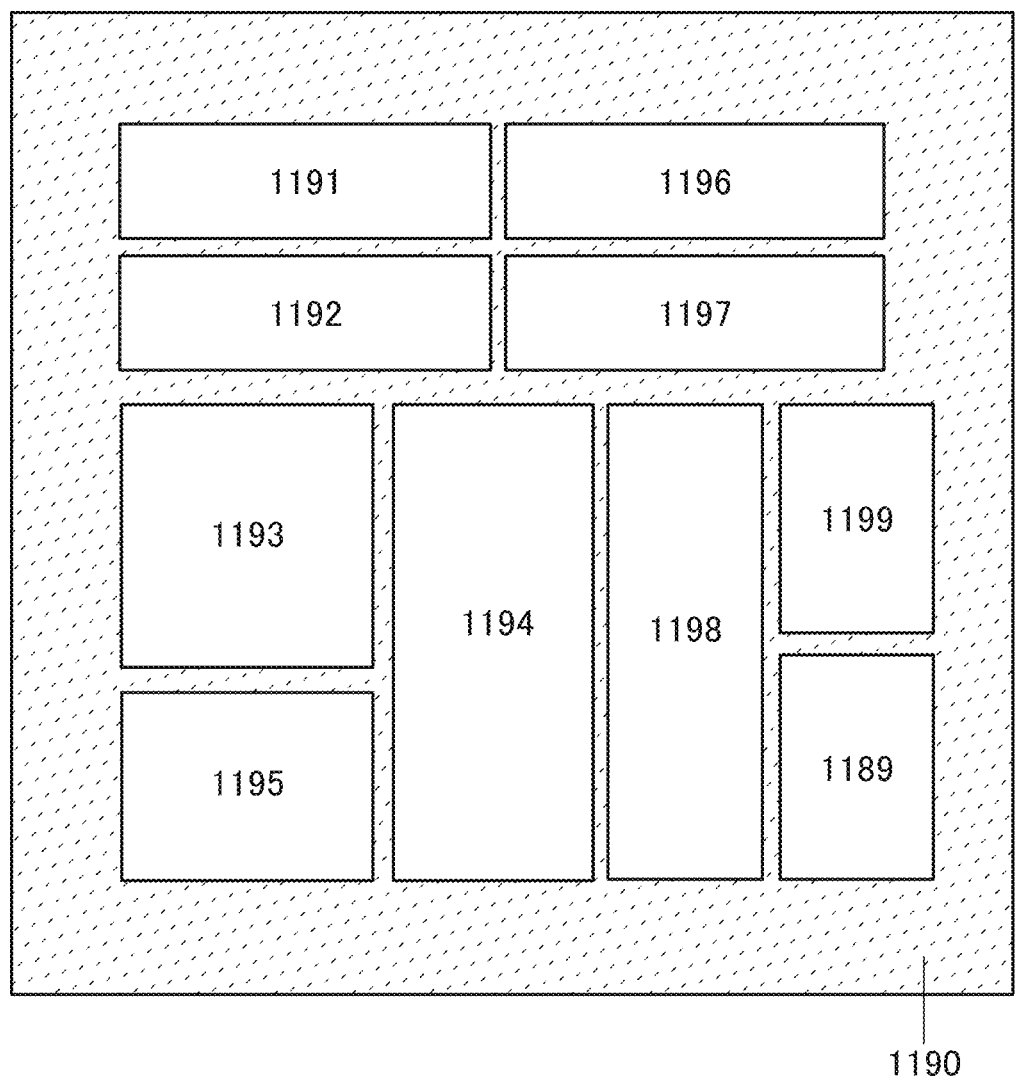
FIG. 11 is a block diagram illustrating a CPU.

FIG. 11 illustrates a block diagram of an arithmetic processing unit 1100. FIG. 11 illustrates a structure example of a CPU as a structure example that can be used for the arithmetic processing unit 1100.

The arithmetic processing unit 1100 illustrated in FIG. 11 includes, over a substrate 1190, an ALU 1191 (Arithmetic logic unit, arithmetic circuit), an ALU controller 1192, an instruction decoder 1193, an interrupt controller 1194, a timing controller 1195, a register 1196, a register controller 1197, a bus interface 1198, a cache 1199, and a cache interface 1189. A semiconductor substrate, an SOI substrate, a glass substrate, or the like is used as the substrate 1190. The central processing unit 1100 may include a rewritable ROM and a ROM interface. In addition, the cache 1199 and the cache interface 1189 may be provided in a separate chip.

The cache 1199 is connected via the cache interface 1189 to a main memory provided in another chip. The cache interface 1189 has a function of supplying part of data held in the main memory to the cache 1199. The cache 1199 has a function of holding the data.

The arithmetic processing unit 1100 illustrated in FIG. 11 is only an example with a simplified structure, and the actual arithmetic processing unit 1100 has a variety of structures depending on the application. For example, the arithmetic processing unit 1100 may have a structure in which a structure including the arithmetic processing unit 1100 illustrated in FIG. 11 or an arithmetic circuit is considered as one core, a plurality of cores are included, and the cores operate in parallel, namely a structure like that of a GPU. In addition, the number of bits that the arithmetic processing unit 1100 can process in an internal arithmetic circuit or in a data bus can be 8 bits, 16 bits, 32 bits, 64 bits, or the like, for example.

An instruction that is input to the arithmetic processing unit 1100 through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the arithmetic processing unit 1100 is executing a program, the interrupt controller 1194 judges an interrupt request from an external input/output device or a peripheral circuit on the basis of its priority and a mask state, and processes the request. The register controller 1197 generates an address of the register 1196, and reads/writes data from/to the register 1196 in accordance with the state of the arithmetic processing unit 1100.

In addition, the timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator portion for generating an internal clock signal based on a reference clock signal, and supplies the internal clock signal to the above various circuits.

In the arithmetic processing unit 1100 illustrated in FIG. 11, a memory device is provided in the register 1196 and the cache 1199. For example, the semiconductor device 100 or the like described in the above embodiments may be used as the memory device.

In the arithmetic processing unit 1100 illustrated in FIG. 11, the register controller 1197 selects a retention operation in the register 1196 in accordance with an instruction from the ALU 1191. That is, the register controller 1197 selects whether data retention by a flip-flop is performed or data retention by a capacitor is performed in the memory cell included in the register 1196. In the case where data retention by the flip-flop is selected, power supply voltage is supplied to the memory cell in the register 1196. In the case where data retention by the capacitor is selected, the data is rewritten into the capacitor, and supply of power supply voltage to the memory cell in the register 1196 can be stopped.

Note that the arithmetic processing unit 1100 is not limited to a CPU and may be a GPU, a DSP (Digital Signal Processor), an FPGA (Filed-Programmable Gate Array), or the like.

Figure 12A:
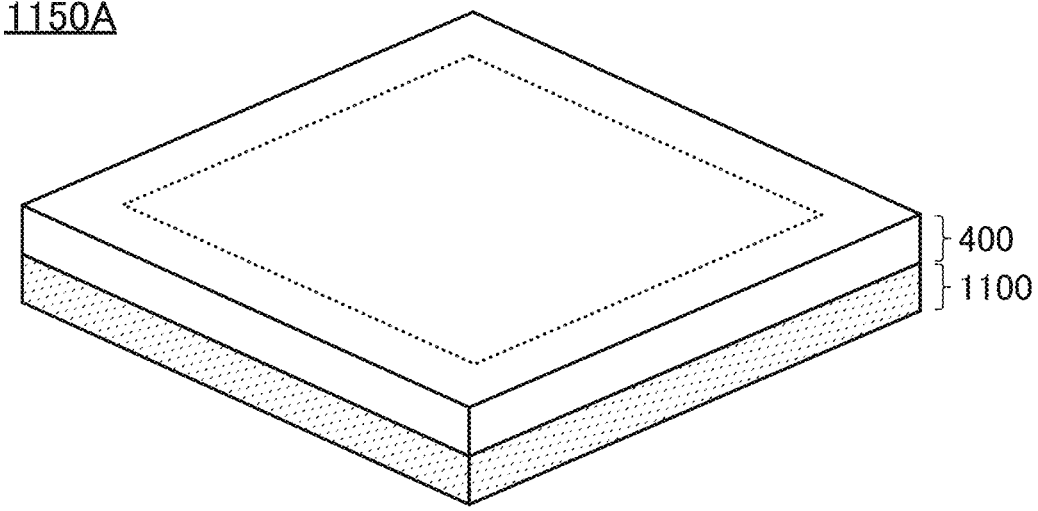
FIG. 12A and FIG. 12B are perspective views of a semiconductor device.
Figure 12B:
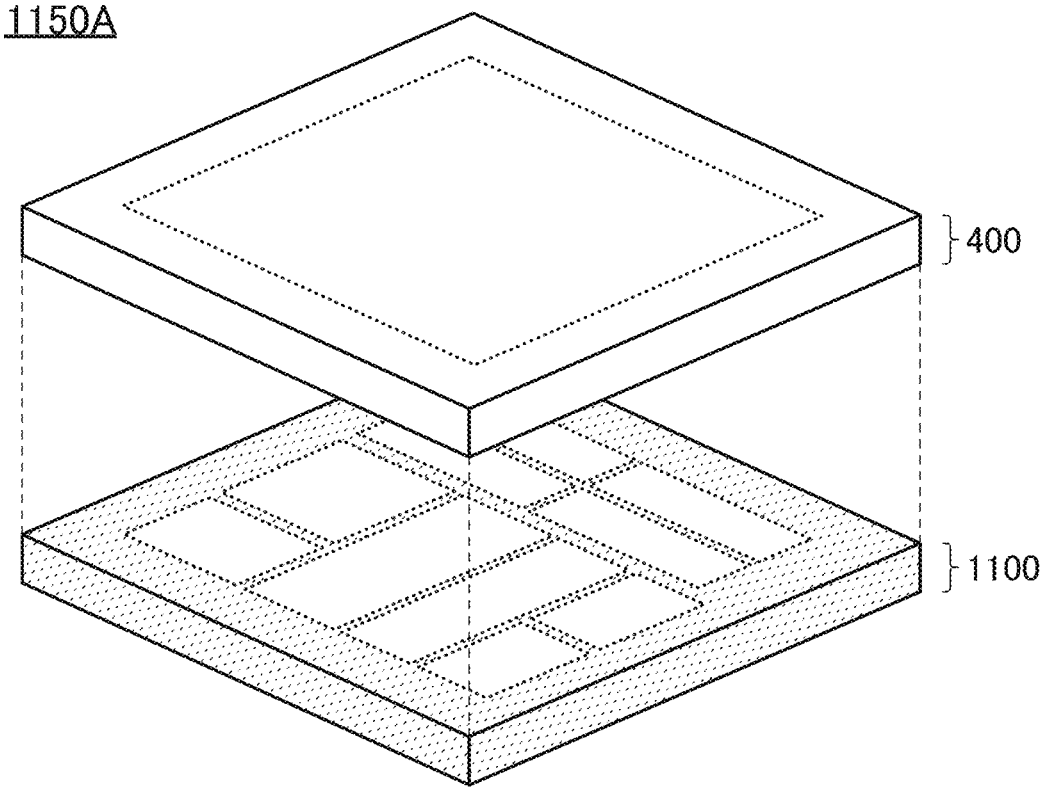

The semiconductor device 400 described in the above embodiment and the arithmetic processing unit 1100 can be provided to overlap with each other. FIG. 12A and FIG. 12B illustrate perspective views of a semiconductor device 1150A. The semiconductor device 1150A includes the semiconductor device 400 functioning as a memory device over the arithmetic processing unit 1100. The arithmetic processing unit 1100 and the semiconductor device 400 have an overlap region. For easy understanding of the structure of the semiconductor device 1150A, the arithmetic processing unit 1100 and the semiconductor device 400 are separately illustrated in FIG. 12B.

Overlapping the semiconductor device 400 and the arithmetic processing unit 1100 can shorten the connection distance therebetween. Accordingly, the communication speed therebetween can be increased. Moreover, since the connection distance is short, power consumption can be reduced.

Figure 13A:
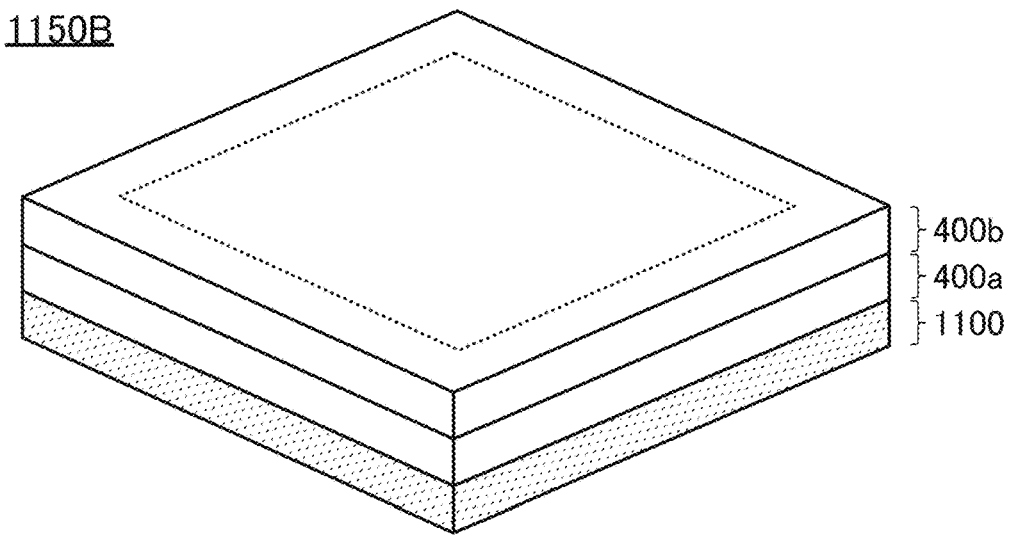
FIG. 13A and FIG. 13B are perspective views of a semiconductor device.
Figure 13B:
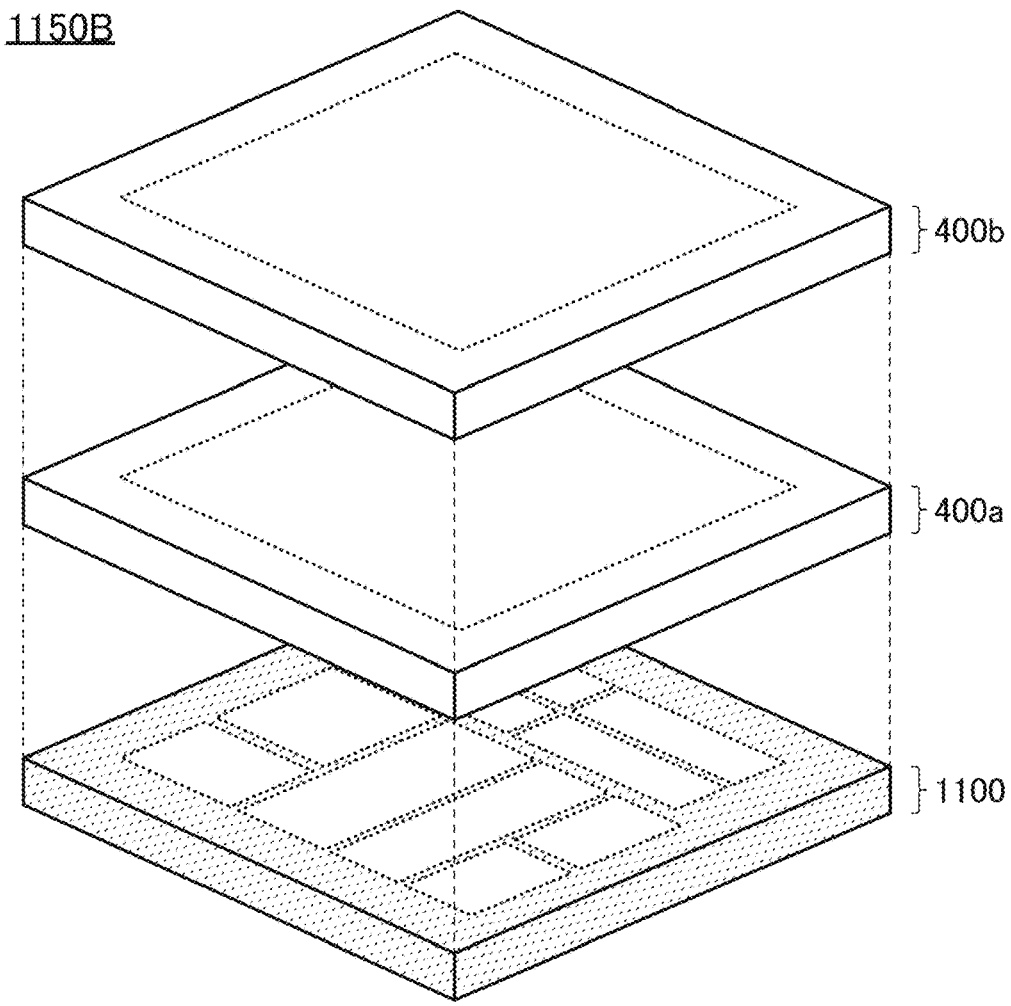

In addition, a plurality of semiconductor devices 400 may be provided to overlap the arithmetic processing unit 1100. FIG. 13A and FIG. 13B illustrate perspective views of a semiconductor device 1150B. The semiconductor device 1150B includes a semiconductor device 400a and a semiconductor device 400b over the arithmetic processing unit 1100. The arithmetic processing unit 1100, the semiconductor device 400a, and the semiconductor device 400b have an overlap region. For easy understanding of the structure of the semiconductor device 1150B, the arithmetic processing unit 1100, the semiconductor device 400a, and the semiconductor device 400b are separately illustrated in FIG. 13B.

The semiconductor device 400a and the semiconductor device 400b function as memory devices. For example, a NOR memory device may be used for one of the semiconductor device 400a and the semiconductor device 400b, and a NAND memory device may be used for the other thereof. Both the semiconductor device 400a and the semiconductor device 400b may be NAND memory devices, or may be NOR memory devices. Examples of the NOR memory device include a DRAM, an SRAM, and the like. A NOR memory device can operate at higher speed than a NAND memory device; thus, for example, part of the semiconductor device 400a can also be used as the main memory and/or the cache 1199. Note that the stacking order of the semiconductor device 400a and the semiconductor device 400b may be reverse.

Figure 14A:
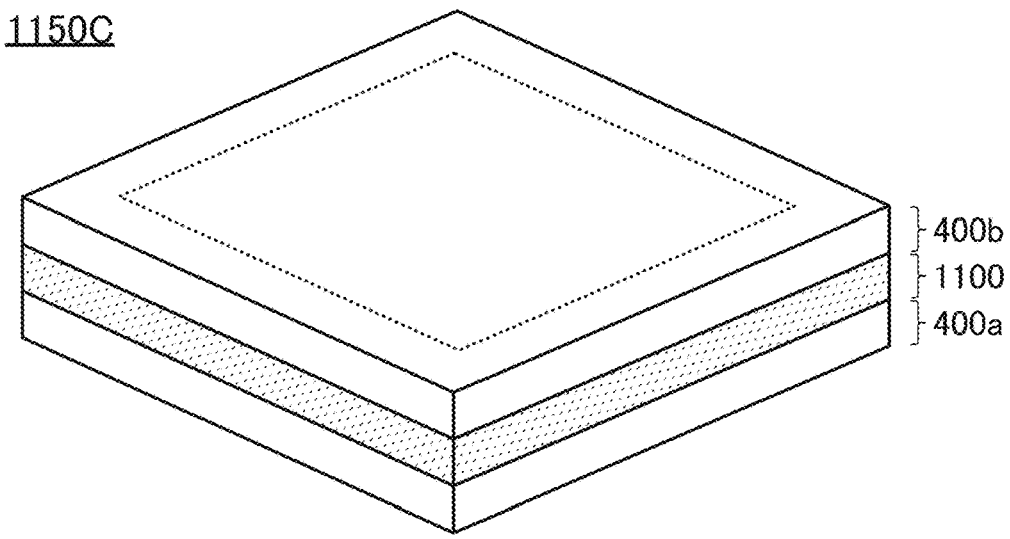
FIG. 14A and FIG. 14B are perspective views of a semiconductor device.
Figure 14B:
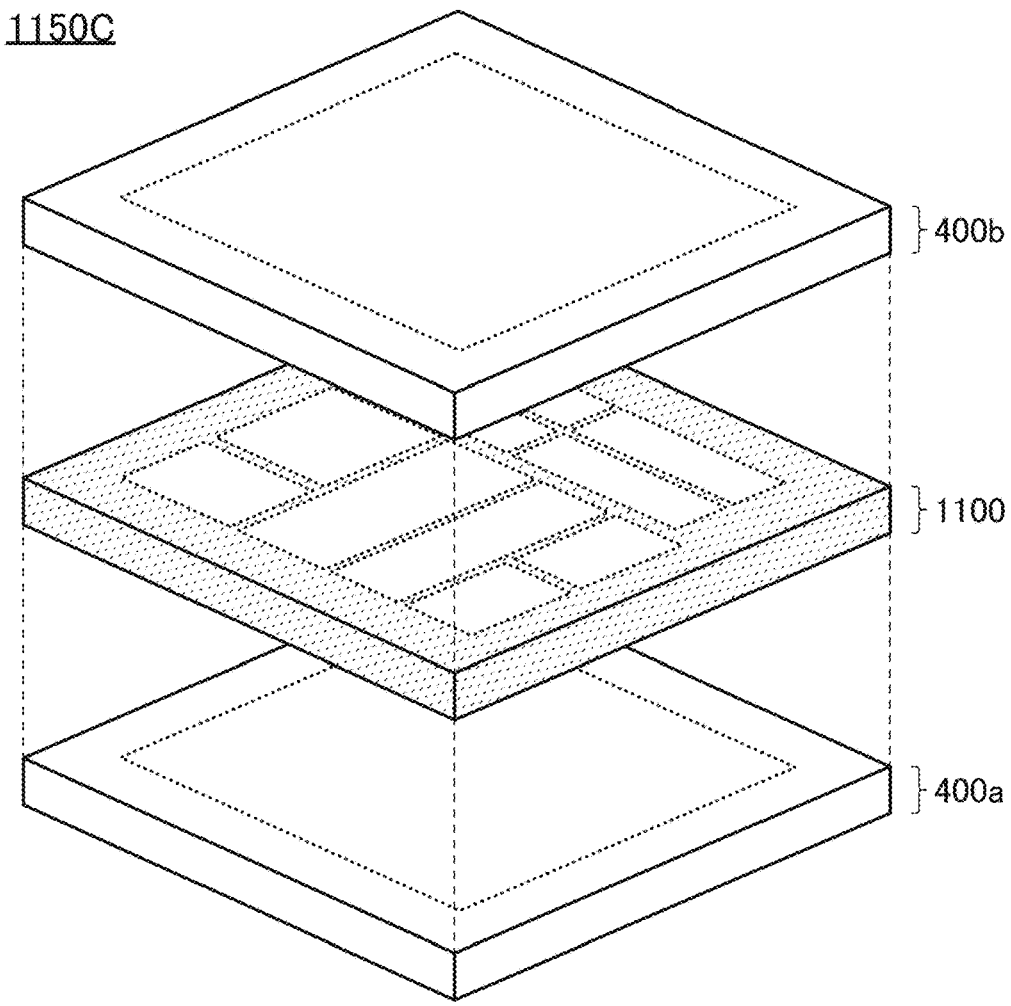

FIG. 14A and FIG. 14B illustrate perspective views of a semiconductor device 1150C. The semiconductor device 1150C has a structure in which the arithmetic processing unit 1100 is sandwiched between the semiconductor device 400a and the semiconductor device 400b. The arithmetic processing unit 1100, the semiconductor device 400a, and the semiconductor device 400b have an overlap region. For easy understanding of the structure of the semiconductor device 1150C, the arithmetic processing unit 1100, the semiconductor device 400a, and the semiconductor device 400b are separately illustrated in FIG. 14B.

With the structure of the semiconductor device 1150C, the communication speed between the semiconductor device 400a and the arithmetic processing unit 1100 and the communication speed between the semiconductor device 400b and the arithmetic processing unit 1100 can be both increased. Moreover, power consumption can be reduced compared to the semiconductor device 1150B.

The semiconductor device of one embodiment of the present invention can be used for an artificial neural network. A structure example of the artificial neural network is described below.

Figure 15A:
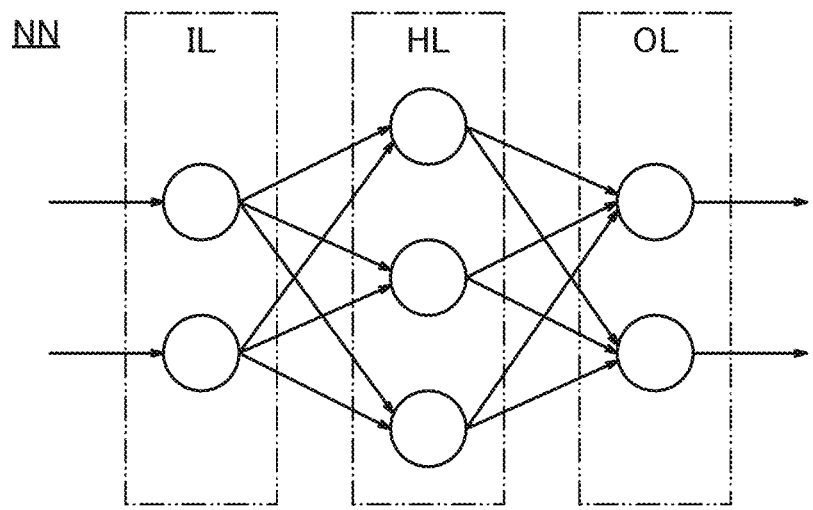
FIG. 15A and FIG. 15B are diagrams illustrating a structure example of a neural network.

FIG. 15A illustrates a structure example of a neural network NN. The neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as a DNN (deep neural network), and learning using a deep neural network can also be referred to as deep learning.

Input data is input to neurons in the input layer IL, output signals of neurons in the previous layer or the subsequent layer are input to neurons in the middle layer HL, and output signals of neurons in the previous layer are input to neurons in the output layer OL. Note that each neuron may be connected to all the neurons in the previous and subsequent layers (full connection), or may be connected to some of the neurons.

Figure 15B:
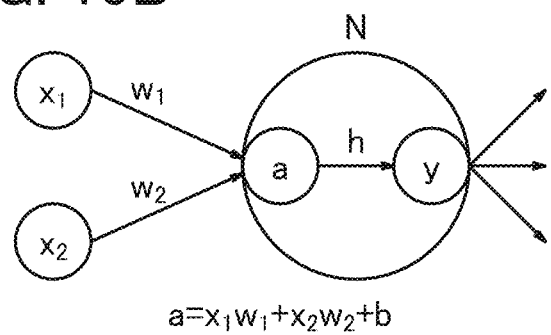

FIG. 15B shows an example of arithmetic operation with neurons. Here, a neuron N and two neurons in the previous layer which output signals to the neuron N are illustrated. An output $x_1$ of a neuron in the previous layer and an output $x_2$ of a neuron in the previous layer are input to the neuron N. Then, in the neuron N, a total sum $x_1w_1+x_2w_2$ of a multiplication result ($x_1w_1$) of the output $x_1$ and a weight $w_1$ and a multiplication result ($x_2w_2$) of the output $x_2$ and a weight $w_2$ is calculated, and then a bias b is added as necessary, so that the value $a=x_1w_1+x_2w_2+b$ is obtained. Then, the value a is converted with an activation function h, and an output signal $y=h(a)$ is output from the neuron N.

In this manner, the arithmetic operation with the neurons includes the arithmetic operation that sums the products of the outputs and the weights of the neurons in the previous layer, that is, the product-sum operation ($x_1w_1+x_2w_2$ described above). This product-sum operation may be performed using a program on software or may be performed using hardware. In the case where the product-sum operation is performed using hardware, a product-sum operation circuit can be used. Either a digital circuit or an analog circuit can be used as this product-sum operation circuit. In the case where an analog circuit is used as the product-sum operation circuit, the circuit scale of the product-sum operation circuit can be reduced, or higher processing speed and lower power consumption can be achieved by reduced frequency of access to a memory.

In the case where an analog circuit is used as the product-sum operation circuit, analog data is used as weight data. The semiconductor device 100 of one embodiment of the present invention can hold analog data without converting the analog data into a digital value. Thus, a converter circuit such as DAC (Digital to Analog Converter) and/or ADC (Analog to Digital Converter) can be reduced, achieving a reduction in power consumption and the area occupied by the semiconductor device.

This embodiment can be combined as appropriate with any of the other embodiments and the like described in this specification.

Embodiment 4

In this embodiment, structure examples of transistors that can be used in the semiconductor device described in the above embodiment are described. As an example, a structure in which transistors having different electrical characteristics are stacked is described. With the structure, the flexibility in design of the semiconductor device can be increased. Stacking transistors having different electrical characteristics can increase the degree of integration of the semiconductor device.

Figure 16:
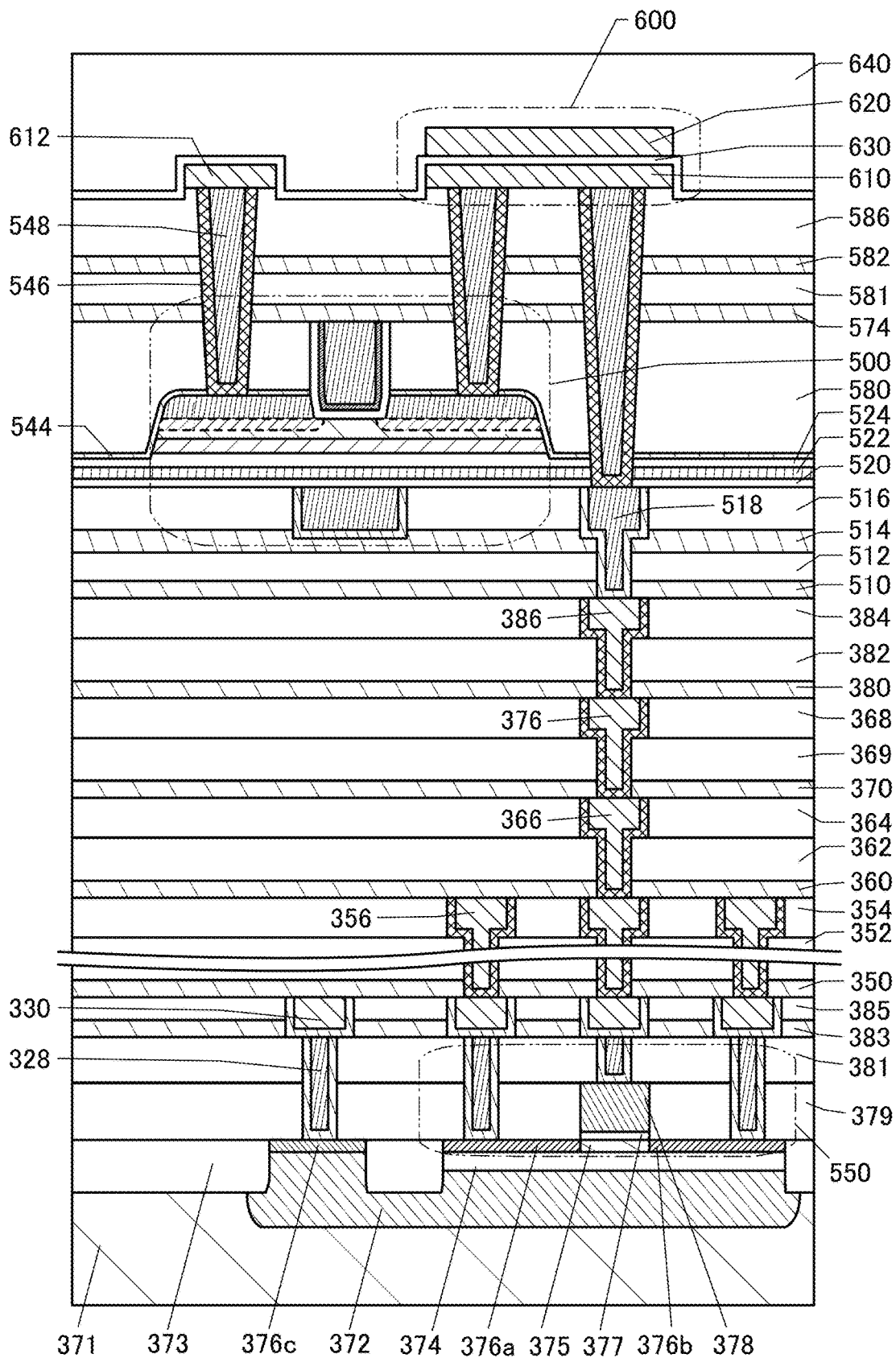
FIG. 16 is a diagram illustrating a structure example of a semiconductor device.
Figure 17A:
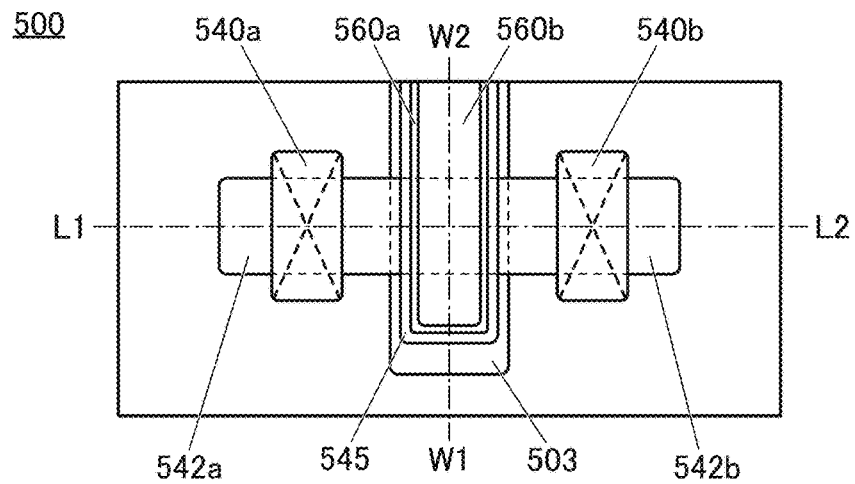
FIG. 17A to FIG. 17C are diagrams illustrating a structure example of a transistor.
Figure 17B:
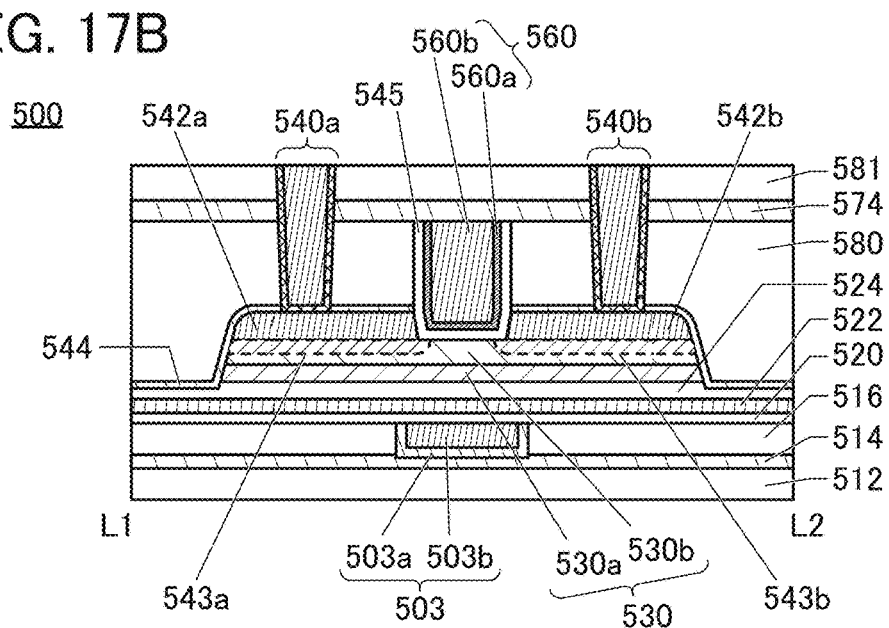
Figure 17C:
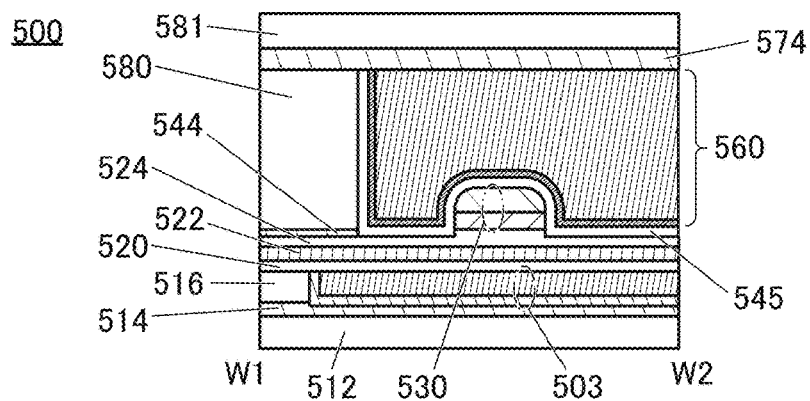

FIG. 16 illustrates part of a cross-sectional structure of a semiconductor device. The semiconductor device illustrated in FIG. 16 includes a transistor 550, a transistor 500, and a capacitor 600. FIG. 17A is a top view of the transistor 500. FIG. 17B is a cross-sectional view of a portion indicated by a dashed-dotted line L1-L2 in FIG. 17A, and is a cross-sectional view in the channel length direction of the transistor 500. FIG. 17C is a cross-sectional view of a portion indicated by a dashed-dotted line W1-W2 in FIG. 17A, and is a cross-sectional view in the channel width direction of the transistor 500. For example, the transistor 500 corresponds to an OS transistor included in the semiconductor device 100 described in the above embodiment, that is, a transistor including an oxide semiconductor in its channel formation region. The transistor 550 corresponds to a Si transistor included in the driver circuit 410 described in the above embodiment, that is, a transistor including silicon in its channel formation region.

The transistor 500 is an OS transistor. The off-state current of an OS transistor is extremely low. Accordingly, data voltage or electric charge written to a memory node through the transistor 500 can be held for a long time. In other words, power consumption of the semiconductor device can be reduced because the memory node has a low frequency of refresh operation or requires no refresh operation.

In FIG. 16, the transistor 500 is provided above the transistor 550, and the capacitor 600 is provided above the transistor 550 and the transistor 500.

The transistor 550 is provided on a substrate 371. The substrate 371 is a p-type silicon substrate, for example. The substrate 371 may be an n-type silicon substrate. An oxide layer 374 is preferably an insulating layer formed with an oxide buried (Burried oxide) into the substrate 371 (the insulating layer is also referred to as a BOX layer), for example, is a silicon oxide. The transistor 550 is formed using a single crystal silicon provided over the substrate 371 with the oxide layer 374 sandwiched therebetween; that is, the transistor 550 is provided on an SOI (Silicon On Insulator) substrate.

The substrate 371 included in the SOI substrate is provided with an insulator 373 serving as an element isolation layer. The substrate 371 includes a well region 372. The well region 372 is a region to which n-type or p-type conductivity is imparted in accordance with the conductivity of the transistor 550. The single-crystal silicon in the SOI substrate is provided with a semiconductor region 375 and a low-resistance region 376a and a low-resistance region 376b each of which function as a source region or a drain region. A low-resistant region 376c is provided over the well region 372.

The transistor 550 can be provided so as to overlap with the well region 372 to which an impurity element imparting conductivity is added. The well region 372 can function as a bottom-gate electrode of the transistor 550 by independently changing the potential of the low-resistance region 376c. Moreover, the threshold voltage of the transistor 550 can be controlled. In particular, when a negative potential is applied to the well region 372, the threshold voltage of the transistor 550 can be further increased, and the off-state current can be reduced. Thus, a negative potential is applied to the well region 372, so that a drain current when a potential applied to a gate electrode of the Si transistor is 0 V can be reduced. As a result, power consumption due to shoot-through current or the like in the arithmetic circuit including the transistor 550 can be reduced, and the arithmetic efficiency can be improved.

The transistor 550 preferably has a structure in which the top surface and the side surface in the channel width direction of the semiconductor layer are covered with a conductor 378 with an insulator 377 therebetween, that is, a Fin-type structure. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

The conductor 378 sometimes functions as a first gate (also referred to as a top gate) electrode. In addition, the well region 372 sometimes functions as a second gate (also referred to as a bottom gate) electrode. In that case, a potential applied to the well region 372 can be controlled through the low-resistance region 376c.

A region of the semiconductor region 375 where a channel is formed, a region in the vicinity thereof, the low-resistance region 376a and the low-resistance region 376b each functioning as a source region or a drain region, the low-resistance region 376c connected to an electrode controlling a potential of the well region 372, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be a HEMT with the use of GaAs and GaAlAs, or the like.

The well region 372, the low-resistance region 376a, the low-resistance region 376b, and the low-resistance region 376c contain an element which imparts n-type conductivity, such as arsenic or phosphorus, or an element which imparts p-type conductivity, such as boron, in addition to the semiconductor material used for the semiconductor region 375.

For the conductor 378 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used. Alternatively, silicide such as nickel silicide may be used for the conductor 378.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

To form each of the low-resistance region 376a, the low-resistance region 376b, and the low-resistance region 376c, another conductor, for example, silicide such as nickel silicide may be stacked. With this structure, the conductivity of the region functioning as an electrode can be increased. At this time, an insulator functioning as a sidewall spacer (also referred to as a sidewall insulating layer) may be provided at the side surface of the conductor 378 functioning as a gate electrode and the side surface of the insulator functioning as a gate insulating film. This structure can prevent the conductor 378 and the low-resistance region 376*a* and the low-resistance region 376*b* from being brought into a conduction state.

An insulator 379, an insulator 381, an insulator 383, and an insulator 385 are stacked in this order to cover the transistor 550.

For the insulator 379, the insulator 381, the insulator 383, and the insulator 385, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 381 may have a function of a planarization film for eliminating a level difference caused by the transistor 550 or the like provided below the insulator 381. For example, a top surface of the insulator 381 may be planarized by planarization treatment using a chemical mechanical polishing (CMP) method or the like to improve planarity.

In addition, for the insulator 383, it is preferable to use a film having a barrier property that prevents diffusion of hydrogen or impurities from the substrate 371, the transistor 550, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 383 that is converted into hydrogen atoms per area of the insulator 383 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 385 is preferably lower than that of the insulator 383. For example, the dielectric constant of the insulator 385 is preferably lower than 4, further preferably lower than 3. The dielectric constant of the insulator 385 is, for example, preferably 0.7 times or less, further preferably 0.6 times or less the dielectric constant of the insulator 383. When a material with a low permittivity is used for an interlayer film, parasitic capacitance generated between wirings can be reduced.

A conductor 328, a conductor 330, and the like that are connected to the capacitor 600 or the transistor 500 are embedded in the insulator 379, the insulator 381, the insulator 383, and the insulator 385. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

A wiring layer may be provided over the insulator 385 and the conductor 330. For example, in FIG. 16, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

Note that for example, like the insulator 383, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity as a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 16, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, like the insulator 383, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 16, an insulator 370, an insulator 369, and an insulator 368 are provided to be stacked in this order. Furthermore, the conductor 376 is formed in the insulator 370, the insulator 369, and the insulator 368. The conductor 376 has a function of a plug or a wiring. Note that the conductor 376 can be provided using a material similar to those for the conductor 328 and the conductor 330.

Note that for example, like the insulator 383, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 368 and the conductor 376. For example, in FIG. 16, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, like the insulator 383, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen and hydrogen is preferably used for any of the insulator 510, the insulator 512, the insulator 514, and the insulator 516.

For example, for the insulator 510 and the insulator 514, it is preferable to use a film having a barrier property against hydrogen and impurities diffused from the substrate 371, a region where the transistor 550 is provided, or the like into the region where the transistor 500 is provided. Therefore, a material similar to that for the insulator 383 can be used.

For the film having a barrier property against hydrogen, silicon nitride deposited by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 379 can be used, for example. Furthermore, when a material with a relatively low permittivity is used for these insulators, parasitic capacitance generated between wirings can be reduced. A silicon oxide film, a silicon oxynitride film, or the like can be used for the insulator 512 or the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As illustrated in FIG. 17A to FIG. 17C, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an insulator 545 positioned on a bottom surface and a side surface of the opening; and a conductor 560 positioned on a formation surface of the insulator 545.

In addition, as illustrated in FIG. 17B and FIG. 17C, an insulator 544 is preferably positioned between the insulator 580 and the oxide 530a, the oxide 530b, the conductor 542a, and the conductor 542b. Furthermore, as illustrated in FIG. 17A to FIG. 17C, the conductor 560 preferably includes a conductor 560a provided inside the insulator 545 and a conductor 560b provided to be embedded inside the conductor 560a. Moreover, as illustrated in FIG. 17B and FIG.

17C, an insulator 574 is preferably positioned over the insulator 580, the conductor 560, and the insulator 545.

Note that in this specification and the like, the oxide 530a and the oxide 530b are sometimes collectively referred to as an oxide 530.

Note that although a structure of the transistor 500 in which two layers of the oxide 530a and the oxide 530b are stacked in a region where a channel is formed and its vicinity is illustrated, the present invention is not limited thereto. For example, it is possible to employ a structure in which a single layer of the oxide 530b or a stacked-layer structure of three or more layers is provided.

Furthermore, although the conductor 560 is illustrated to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 16 and FIG. 17A to FIG. 17C is an example, and the structures are not limited thereto; an appropriate transistor can be used in accordance with a circuit configuration and/or a driving method.

Here, the conductor 560 functions as a gate electrode of the transistor 500, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as a gate or a top gate) electrode. In addition, the conductor 503 sometimes functions as a second gate (also referred to as a back gate or a bottom gate) electrode. In that case, the threshold voltage of the transistor 500 can be controlled by changing a potential applied to the conductor 503 not in synchronization with but independently of a voltage applied to the conductor 560. In particular, when a negative potential is applied to the conductor 503, the threshold voltage of the transistor 500 can be further increased, and the off-state current can be reduced. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is illustrated, the present invention is not limited thereto. For example, the conductor 503 may be provided as a single layer or to have a stacked-layer structure of three or more layers.

Here, for the conductor 503a, a conductive material having a function of preventing diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, the function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Note that although the conductor 503 is illustrated to have a stacked layer of the conductor 503a and the conductor 503b in this embodiment, the conductor 503 may have a single-layer structure.

The insulator 520, the insulator 522 and the insulator 524 have a function of a second gate insulating film.

Here, as the insulator 524 that is in contact with the oxide 530, an insulator that contains oxygen more than oxygen in the stoichiometric composition is preferably used. Such oxygen is easily released from the film by heating. In this specification and the like, oxygen released by heating is sometimes referred to as "excess oxygen". That is, a region containing excess oxygen (also referred to as an "excess-oxygen region") is preferably formed in the insulator 524. When such an insulator containing excess oxygen is provided in contact with the oxide 530, oxygen vacancies (Vo) in the oxide 530 can be reduced and the reliability of the transistor 500 can be improved. When hydrogen enters the oxygen vacancies in the oxide 530, such defects (hereinafter, referred to as VoH in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen contained in an oxide semiconductor might reduce the reliability of the transistor. In one embodiment of the present invention, VoH in the oxide 530 is preferably reduced as much as possible so that the oxide 530 becomes a highly purified intrinsic or substantially highly purified intrinsic oxide. It is important to remove impurities such as moisture and hydrogen in an oxide semiconductor (sometimes described as "dehydration" or "dehydrogenation treatment") and to compensate for oxygen vacancies by supplying oxygen to the oxide semiconductor (sometimes described as "oxygen adding treatment") in order to obtain an oxide semiconductor whose VoH is sufficiently reduced. When an oxide semiconductor with sufficiently reduced impurities such as VoH is used for a channel formation region of a transistor, stable electrical characteristics can be given.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of "VoH→Vo+H" occurs. Part of hydrogen generated at this time is bonded to oxygen to be H$_2$O, and removed from the oxide 530 or an insulator in the vicinity of the oxide 530 in some cases. Some hydrogen may be gettered into the conductor 542a and the conductor 542b in some cases.

For the microwave treatment, for example, an apparatus including a power source that generates high-density plasma or an apparatus including a power source that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio (O$_2$/(O$_2$+Ar)) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (Vo). The heat treatment may be performed under reduced pressure. Alternatively, the heat treatment may be performed in such a manner that heat treatment is performed in a nitrogen gas or inert gas atmosphere and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "Vo+O→null". Furthermore, hydrogen remaining in the oxide 530 reacts with supplied oxygen, so that the hydrogen can be removed as H$_2$O (dehydration). This can inhibit recombination of hydrogen remaining in the oxide 530 with oxygen vacancies and formation of VoH.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is less likely to pass).

When the insulator 522 has a function of inhibiting diffusion of oxygen and impurities, oxygen contained in the oxide 530 is not diffused to the insulator 520 side, which is preferable. Furthermore, the conductor 503 can be inhibited from reacting with oxygen contained in the insulator 524 and/or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST) are preferably used, for example. As miniaturization and high integration of transistors progress, a problem such as a leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

It is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 to have a stacked-layer structure that has thermal stability and a high relative permittivity.

Note that in the transistor 500 in FIG. 17A to FIG. 17C, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor is described in detail in another embodiment.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a.

The energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum gently changes at a junction portion of the oxide 530a and the oxide 530b. In other words, the energy level of the conduction band minimum at the junction portion of the oxide 530a and the oxide 530b continuously changes or is continuously connected. This can be obtained by decreasing the density of defect states in a mixed layer formed at the interface between the oxide 530a and the oxide 530b.

Specifically, when the oxide 530a and the oxide 530b contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is used as the oxide 530a.

At this time, the oxide 530b serves as a main carrier path. When the oxide 530a has the above-described structure, the density of defect states at the interface between the oxide 530a and the oxide 530b can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 17B, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

In addition, as illustrated in FIG. 17B, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately determined in consideration of required transistor characteristics.

The insulator 544 can inhibit impurities such as water and hydrogen contained in the insulator 580 from diffusing into the oxide 530b. Furthermore, oxidation of the conductor 542 due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530b. Furthermore, as in the insulator 524, the concentration of impurities such as water or hydrogen in the insulator 545 is preferably reduced. The thickness of the insulator 545 is preferably greater than or equal to 1 nm and less than or equal to 20 nm. The above-described microwave treatment may be performed before and/or after the insulator 545 is formed.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 into the conductor 560. Providing the metal oxide that inhibits diffusion of oxygen inhibits diffusion of excess oxygen from the insulator 545 into the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as a leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high dielectric constant.

Although the conductor 560 that functions as the first gate electrode and has a two-layer structure is illustrated in FIG. 17B and FIG. 17C, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material that has a function of inhibiting the diffusion of oxygen (e.g., at least one of an oxygen atom, an oxygen molecule, and the like). When the conductor 560a has a function of inhibiting diffusion of oxygen, a reduction in conductivity of the conductor 560b due to oxidation caused by oxygen contained in the insulator 545 can be inhibited. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited using a sputtering method, the conductor 560a can have a reduced value of electrical resistance to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. For example, a conductive material containing tungsten, copper, or aluminum as its main component can be used. The conductor 560b may have a stacked-layer structure, for example, a stacked-layer structure of any of the above conductive materials and titanium or titanium nitride.

The insulator 580 is provided over the conductor 542a and the conductor 542b with the insulator 544 therebetween. The insulator 580 preferably includes an excess-oxygen region. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like is preferably contained as the insulator 580. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed to overlap with the region between the conductor 542*a* and the conductor 542*b*. Accordingly, the conductor 560 is formed to be embedded in the opening of the insulator 580 and the region between the conductor 542*a* and the conductor 542*b*.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, atop surface of the conductor 560, and atop surface of the insulator 545. When the insulator 574 is deposited using a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540*a* and a conductor 540*b* are positioned in openings formed in the insulator 581, the insulator 574, the insulator 580, and the insulator 544. The conductor 540*a* and the conductor 540*b* are provided to face each other with the conductor 560 therebetween. The structure of the conductor 540*a* and the conductor 540*b* are similar to a structure of a conductor 546 and a conductor 548 that will be described later.

An insulator 582 is provided over the insulator 581. A substance having a barrier property against oxygen and hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for a protective film of the transistor 500.

In addition, an insulator 586 is provided over the insulator 582. For the insulator 586, a material similar to that for the insulator 379 can be used. Furthermore, when a material with a relatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using a material similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. For the insulator 640, a material similar to that for the insulator 379 can be used. In addition, the insulator 640 may function as a planarization film that covers an uneven shape therebelow.

With the use of this structure, a semiconductor device using a transistor including an oxide semiconductor can be miniaturized or highly integrated.

This embodiment can be combined as appropriate with any of the other embodiments and the like described in this specification.

Embodiment 5

Described in this embodiment is a metal oxide (hereinafter also referred to as an oxide semiconductor) that can be used in an OS transistor described in the above embodiment.

The metal oxide preferably contains one of indium and zinc. In particular, indium and zinc are preferably contained. In addition to them, aluminum, gallium, yttrium, tin, or the like is preferably contained. Furthermore, one kind or two or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of crystal structures of an oxide semiconductor is described with reference to FIG. 18A. FIG. 18A is a diagram showing classification of crystal structures of an oxide semiconductor, typically IGZO (a metal oxide containing In, Ga, and Zn).

As shown in FIG. 18A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite). Note that the term "Crystalline" excludes single crystal, poly crystal, and completely amorphous. The term "Crystal" includes single crystal and poly crystal.

Note that the structures in the thick frame in FIG. 18A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 18B shows an XRD spectrum, which is obtained using GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 18B and obtained by GIXD measurement is hereinafter simply referred to as an XRD spectrum. The CAAC-IGZO film in FIG. 18B has a composition in the vicinity of In:Ga:Zn=4:2:3 [atomic ratio]. The CAAC-IGZO film in FIG. 18B has a thickness of 500 nm.

As shown in FIG. 18B, a clear peak indicating crystallinity is detected in the XRD spectrum of the CAAC-IGZO film. Specifically, a peak indicating c-axis alignment is detected at $2\theta$ of around 31° in the XRD spectrum of the CAAC-IGZO film. As shown in FIG. 18B, the peak at $2\theta$ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 18C shows a diffraction pattern of a CAAC-IGZO film. FIG. 18C shows a diffraction pattern obtained with the NBED method in which an electron beam is incident in the direction parallel to the substrate. The CAAC-IGZO film in FIG. 18C has a composition in the vicinity of In:Ga:Zn=4:2:3 [atomic ratio]. In the nanobeam electron diffraction method, electron diffraction is performed with a probe diameter of 1 nm.

As shown in FIG. 18C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 18A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region with a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one kind or two or more kinds selected from aluminum, gallium, yttrium, tin, titanium, and the like), the CAAC-OS tends to have a layered crystal structure (also referred to as a layered structure) in which layers containing indium (In) and oxygen (hereinafter In layers) and layers containing the element M, zinc (Zn), and oxygen (hereinafter (M,Zn) layers) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, and the like, the CAAC-OS can be regarded as an oxide semiconductor that has small amounts of impurities, defects, and the like (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for an OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has a higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. As another example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), high field-effect mobility ($\mu$), and an excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is set lower than or equal to $1 \times 10^{18}$ atoms/cm$^3$, preferably lower than or equal to $2 \times 10^{16}$ atoms/cm$^3$.

When the oxide semiconductor contains nitrogen, the oxide semiconductor easily becomes n-type because of generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be combined with any of the other embodiments in this specification as appropriate.

Embodiment 6

In this embodiment, examples of a semiconductor wafer where the semiconductor device or the like described in the above embodiment is formed and electronic components incorporating the semiconductor device are described.

<Semiconductor Wafer>

Figure 19A:
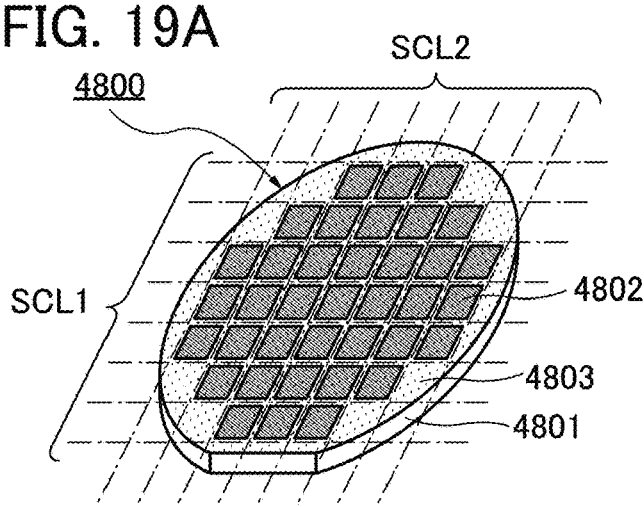
FIG. 19A is a perspective view illustrating an example of a semiconductor wafer.

First, an example of a semiconductor wafer where a semiconductor device or the like is formed is described using FIG. 19A.

A semiconductor wafer 4800 illustrated in FIG. 19A includes a wafer 4801 and a plurality of circuit portions 4802 provided on atop surface of the wafer 4801. Note that a portion without the circuit portion 4802 on the top surface of the wafer 4801 is a spacing 4803 that is a region for dicing.

The semiconductor wafer 4800 can be manufactured by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as a next step. Dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

Figure 19B:
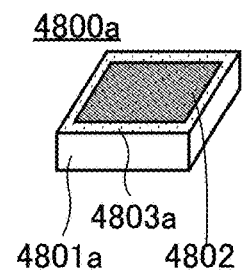
FIG. 19B is a perspective view illustrating an example of a chip.

With the dicing step, a chip 4800a as illustrated in FIG. 19B can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 19A. The element substrate may be a rectangular semiconductor wafer, for example. The shape of the element substrate can be changed as appropriate, depending on a manufacturing process of an element and an apparatus for manufacturing the element.

<Electronic Component>

Figure 19C:
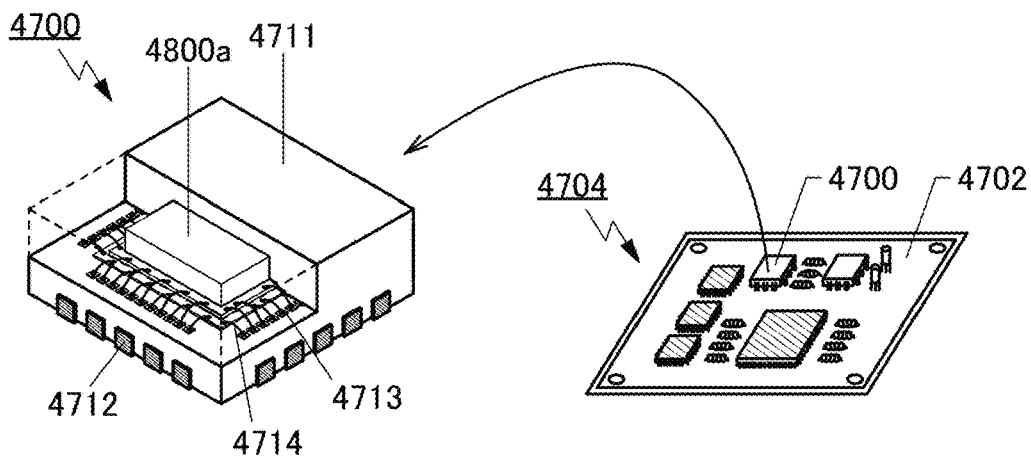
FIG. 19C and FIG. 19D are perspective views illustrating examples of electronic components.

FIG. 19C illustrates a perspective view of an electronic component 4700 and a substrate (a mounting board 4704) on which the electronic component 4700 is mounted. The electronic component 4700 illustrated in FIG. 19C includes a chip 4800a in a mold 4711. As the chip 4800a, the memory device or the like of one embodiment of the present invention can be used.

To illustrate the inside of the electronic component 4700, some portions are omitted in FIG. 19C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, so that the mounting board 4704 is completed.

Figure 19D:
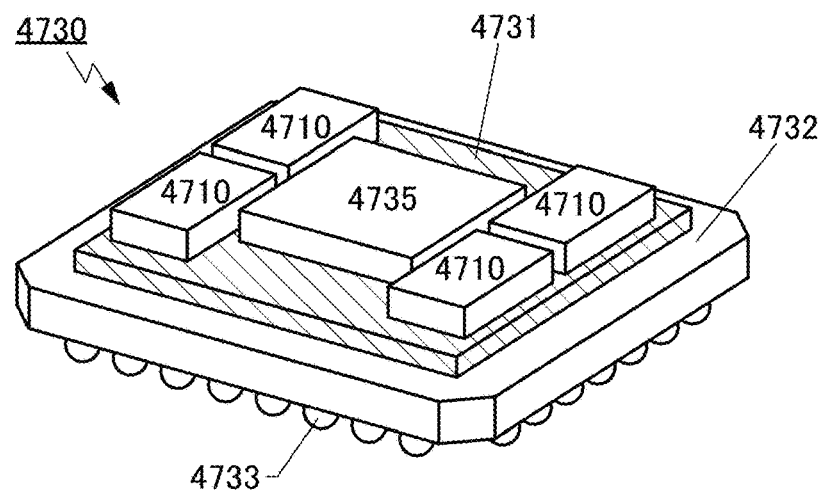

FIG. 19D illustrates a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

Examples of the semiconductor device 4710 include the chip 4800a, the semiconductor device described in the above embodiment, and a high bandwidth memory (HBM). In addition, an integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. In addition, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. Furthermore, a through electrode is provided in the interposer 4731 and the through electrode is used to electrically connect an integrated circuit and the package substrate 4732 in some cases. Moreover, in the case of using a silicon interposer, a TSV (Through Silicon Via) can also be used as the through electrode.

A silicon interposer is preferably used as the interposer 4731. The silicon interposer can be manufactured at lower cost than an integrated circuit because it is not necessary to provide an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In addition, in a SiP, an MCM, or the like using a silicon interposer, a decrease in reliability due to a difference in the coefficient of expansion between an integrated circuit and the interposer is less likely to occur. Furthermore, a surface of a silicon interposer has high planarity; thus, poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on the interposer.

In addition, a heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on a bottom portion of the package substrate 4732. FIG. 19D illustrates an example in which the electrode 4733 is formed of a solder ball. Solder balls are provided in a matrix on the bottom portion of the package substrate 4732, so that BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

This embodiment can be combined as appropriate with any of the other embodiments and the like described in this specification.

Embodiment 7

In this embodiment, application examples of the semiconductor device of one embodiment of the present invention are described.

The semiconductor device of one embodiment of the present invention can be applied to, for example, memory devices of a variety of electronic devices (e.g., information terminals, computers, smartphones, e-book readers, digital still cameras, video cameras, video recording/reproducing devices, navigation systems, game machines, and the like). In addition, the semiconductor device can also be used for image sensors, IoT (Internet of Things), healthcare, and the like. Note that here, the computers refer not only to tablet computers, laptop computers, and desktop computers, but also to large computers such as server systems.

An example of an electronic device including a semiconductor device of one embodiment of the present invention is described. Note that FIG. 20A to FIG. 20J and FIG. 21A to FIG. 21E each illustrate a state where the electronic component 4700 or the electronic component 4730, each of which includes the semiconductor device, is included in an electronic device.

[Cellular Phone]

Figure 20A:
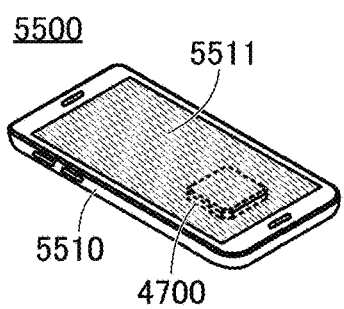
FIG. 20A to FIG. 20J are diagrams illustrating examples of electronic devices.

An information terminal 5500 illustrated in FIG. 20A is a cellular phone (smartphone), which is a type of information terminal. The information terminal 5500 includes a housing 5510 and a display portion 5511, and as input interfaces, a touch panel is provided in the display portion 5511 and a button is provided in the housing 5510.

By applying the semiconductor device of one embodiment of the present invention to the information terminal 5500, the information terminal 5500 can retain a temporary file generated at the time of executing an application (e.g., a web browser's cache or the like).

[Wearable Terminal]

Figure 20B:
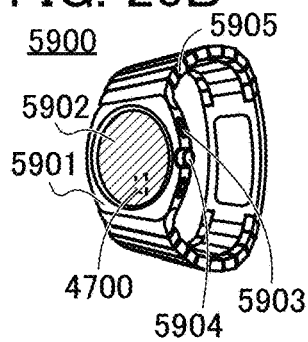

In addition, FIG. 20B illustrates an information terminal 5900 that is an example of a wearable terminal. The information terminal 5900 includes a housing 5901, a display portion 5902, an operation switch 5903, an operation switch 5904, a band 5905, and the like.

Like the information terminal 5500 described above, the wearable terminal can retain a temporary file generated at the time of executing an application by applying the semiconductor device of one embodiment of the present invention to the wearable terminal.

[Information Terminal]

Figure 20C:
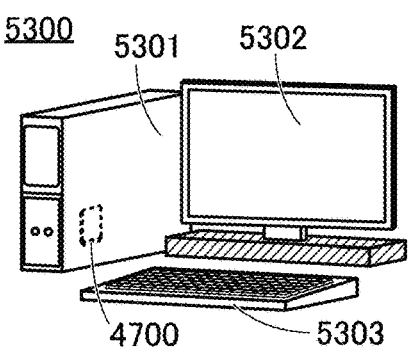

In addition, FIG. 20C illustrates a desktop information terminal 5300. The desktop information terminal 5300 includes a main body 5301 of the information terminal, a display portion 5302, and a keyboard 5303.

Like the information terminal 5500 described above, the desktop information terminal 5300 can retain a temporary file generated at the time of executing an application applying the semiconductor device of one embodiment of the present invention to the desktop information terminal 5300.

Note that although the smartphone, the wearable terminal, and the desktop information terminal are respectively illustrated in FIG. 20A to FIG. 20C as examples of the electronic device, one embodiment of the present invention can be applied to an information terminal other than a smartphone, a wearable terminal, and a desktop information terminal. Examples of information terminals other than a smartphone, a wearable terminal, and a desktop information terminal include a PDA (Personal Digital Assistant), a laptop information terminal, and a workstation.

[Household Appliance]

Figure 20D:
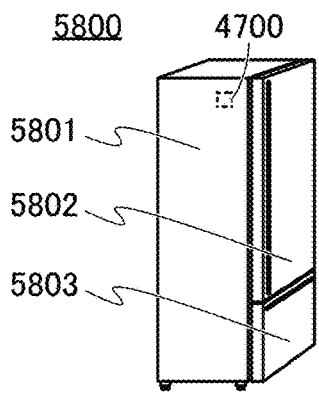

In addition, FIG. 20D illustrates an electric refrigerator-freezer 5800 as an example of a household appliance. The electric refrigerator-freezer 5800 includes a housing 5801, a refrigerator door 5802, a freezer door 5803, and the like. For example, the electric refrigerator-freezer 5800 is an electric refrigerator-freezer that is compatible with IoT (Internet of Things).

The semiconductor device of one embodiment of the present invention can be applied to the electric refrigerator-freezer 5800. The electric refrigerator-freezer 5800 can transmit and receive information on food stored in the electric refrigerator-freezer 5800 and food expiration dates, for example, to and from an information terminal and the like via the Internet. In the electric refrigerator-freezer 5800, the semiconductor device can retain a temporary file generated at the time of transmitting the information.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, an audiovisual appliance, and the like.

[Game Machine]

Figure 20E:
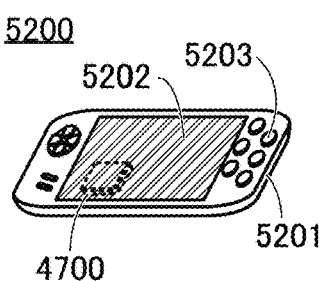

In addition, FIG. 20E illustrates a portable game machine 5200 as an example of a game machine. The portable game machine 5200 includes a housing 5201, a display portion 5202, a button 5203, and the like.

Figure 20F:
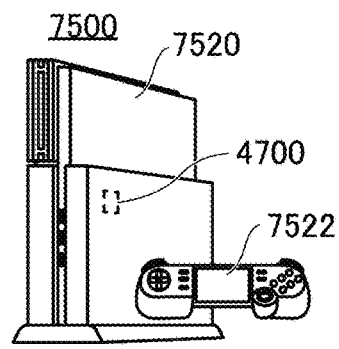

In addition, FIG. 20F illustrates a stationary game machine 7500 as another example of a game machine. The stationary game machine 7500 includes a main body 7520 and a controller 7522. Note that the controller 7522 can be connected to the main body 7520 with or without a wire. Furthermore, although not illustrated in FIG. 20F, the controller 7522 can include a display portion that displays a game image, and an input interface besides a button, such as a touch panel, a stick, a rotating knob, and a sliding knob, for example. Moreover, the shape of the controller 7522 is not limited to that illustrated in FIG. 20F, and the shape of the controller 7522 may be changed in various ways in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

In addition, videos displayed on the game machine can be output with a display device such as a television device, a personal computer display, a game display, or a head-mounted display.

The semiconductor device described in the above embodiment is employed for the portable game machine 5200 or the stationary game machine 7500, so that the portable game machine 5200 with low power consumption or the stationary game machine 7500 with low power consumption can be achieved. Moreover, heat generation from a circuit can be reduced owing to low power consumption; thus, the influence of heat generation on the circuit itself, a peripheral circuit, and a module can be reduced.

Moreover, the semiconductor device described in the above embodiment is employed for the portable game machine 5200 or the stationary game machine 7500, so that it is possible to retain a temporary file necessary for arithmetic operation that occurs during game play.

As an example of a game machine, FIG. 20E illustrates a portable game machine. In addition, FIG. 20F illustrates a home-use stationary game machine. Note that an electronic device of one embodiment of the present invention is not limited thereto. Examples of the electronic device of one embodiment of the present invention include an arcade game machine installed in entertainment facilities (a game center, an amusement park, and the like), a throwing machine for batting practice installed in sports facilities, and the like.

[Moving Vehicle]

The semiconductor device described in the above embodiment can be used for a motor vehicle, which is a moving vehicle, and around the driver's seat in a motor vehicle.

Figure 20G:
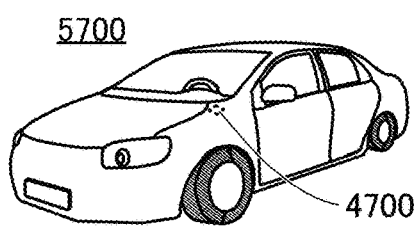

FIG. 20G illustrates a motor vehicle 5700 as an example of a moving vehicle.

An instrument panel that provides various kinds of information by displaying a speedometer, a tachometer, a mileage, a fuel meter, a gearshift state, air-conditioning settings, and the like is provided around the driver's seat in the motor vehicle 5700. In addition, a display device showing the above information may be provided around the driver's seat.

In particular, the display device can compensate for the view obstructed by a pillar or the like, blind areas for the driver's seat, and the like by displaying a video from an imaging device (not illustrated) provided for the motor vehicle 5700, which can increase safety. That is, display of an image from an imaging device provided on the outside of the motor vehicle 5700 can fill in blind areas and increase safety.

The semiconductor device described in the above embodiment can temporarily hold data; thus, the computer can be used to hold temporary data necessary in an automatic driving system for the motor vehicle 5700 and a system for navigation and risk prediction, for example. The display device may be configured to display temporary information regarding navigation, risk prediction, or the like. Moreover, the semiconductor device may be configured to hold a video of a driving recorder provided in the motor vehicle 5700.

Note that although a motor vehicle is described above as an example of a moving vehicle, the moving vehicle is not limited to a motor vehicle. Examples of moving vehicles include a train, a monorail train, a ship, a flying object (a helicopter, an unmanned aircraft (a drone), an airplane, and a rocket), and the like.

[Camera]

The semiconductor device described in the above embodiment can be employed for a camera.

Figure 20H:
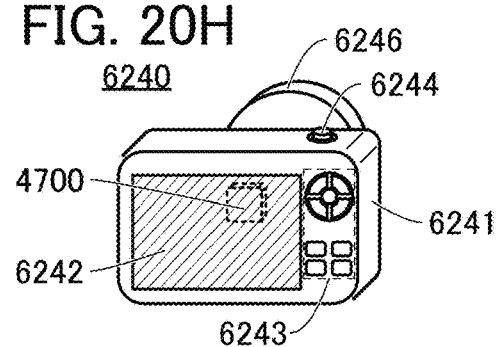

FIG. 20H illustrates a digital camera 6240 as an example of an imaging device. The digital camera 6240 includes a housing 6241, a display portion 6242, operation switches 6243, a shutter button 6244, and the like, and a detachable lens 6246 is attached to the digital camera 6240. Note that here, although the camera 6240 is configured such that the lens 6246 is detachable from the housing 6241 for replacement, the lens 6246 may be integrated with the housing 6241. In addition, the digital camera 6240 can be additionally equipped with a stroboscope, a viewfinder, or the like.

When the semiconductor device described in the above embodiment is employed for the digital camera 6240, the digital camera 6240 with low power consumption can be achieved. Moreover, heat generation from a circuit can be reduced owing to low power consumption; thus, the influence of heat generation on the circuit itself, a peripheral circuit, and a module can be reduced.

[Video Camera]

The semiconductor device described in the above embodiment can be employed for a video camera.

Figure 20I:
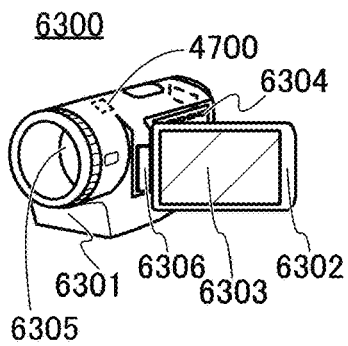

FIG. 20I illustrates a video camera 6300 as an example of an imaging device. The video camera 6300 includes a first housing 6301, a second housing 6302, a display portion 6303, operation switches 6304, a lens 6305, a joint 6306, and the like. The operation switches 6304 and the lens 6305 are provided in the first housing 6301, and the display portion 6303 is provided in the second housing 6302. The first housing 6301 and the second housing 6302 are connected to each other with the joint 6306, and an angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. With the use of the above semiconductor device, the video camera 6300 can retain a temporary file generated in encoding.

[ICD]

The semiconductor device described in the above embodiment can be employed for an implantable cardioverter-defibrillator (ICD).

Figure 20J:
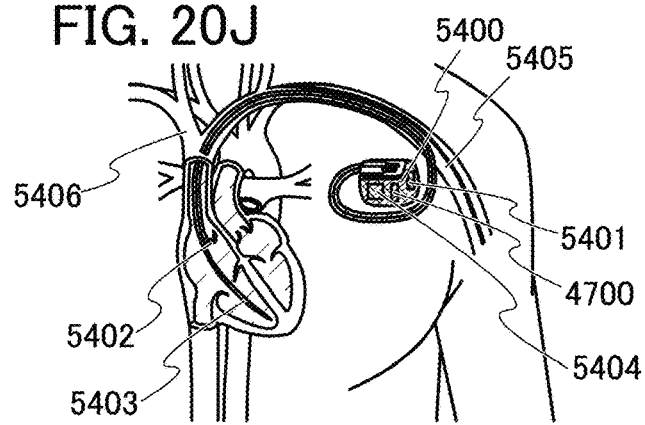

FIG. 20J is a schematic cross-sectional view showing an example of an ICD. An ICD main unit 5400 includes at least a battery 5401, the electronic component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with an end of one of the wires placed in the right ventricle and an end of the other wire placed in the right atrium.

The ICD main unit 5400 functions as a pacemaker and paces the heart when the heart rate is not within a predetermined range. In addition, when the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In addition, in the ICD main unit 5400, data on the heart rate obtained by the sensor or the like, the number of times the treatment with pacing is performed, and the time taken for the treatment, for example, can be stored in the electronic component 4700.

In addition, the antenna 5404 can receive power, and the battery 5401 is charged with the power. Furthermore, when the ICD main unit 5400 includes a plurality of batteries, safety can be increased. Specifically, even when one of the batteries in the ICD main unit 5400 is dead, the other batteries can function properly; thus, the batteries also function as an auxiliary power source.

In addition to the antenna 5404 capable of receiving power, an antenna that can transmit physiological signals may be included to construct, for example, a system that monitors cardiac activity by checking physiological signals such as a pulse, a respiratory rate, a heart rate, and body temperature with an external monitoring device.

[Expansion Device for PC]

The semiconductor device described in the above embodiment can be employed for a calculator such as a PC (Personal Computer) and an expansion device for an information terminal.

Figure 21A:
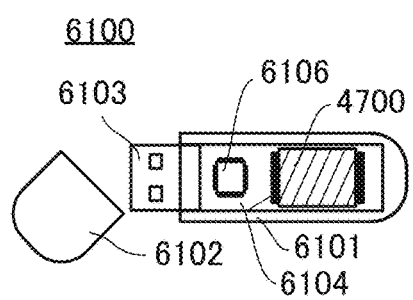
FIG. 21A to FIG. 21E are diagrams illustrating examples of electronic devices.

FIG. 21A illustrates, as an example of the expansion device, a portable expansion device 6100 that includes a chip capable of holding information and is externally provided on a PC. The expansion device 6100 can store information using the chip when connected to a PC with a USB (Universal Serial Bus) or the like, for example. Note that FIG. 21A illustrates the portable expansion device 6100; however, the expansion device of one embodiment of the present invention is not limited thereto and may be a comparatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device or the like described in the above embodiment. For example, the substrate 6104 is provided with the electronic component 4700 and a controller chip 6106. The USB connector 6103 functions as an interface for connection to an external device.

[SD Card]

The semiconductor device described in the above embodiment can be employed for an SD card that can be attached to an electronic device such as an information terminal or a digital camera.

Figure 21B:
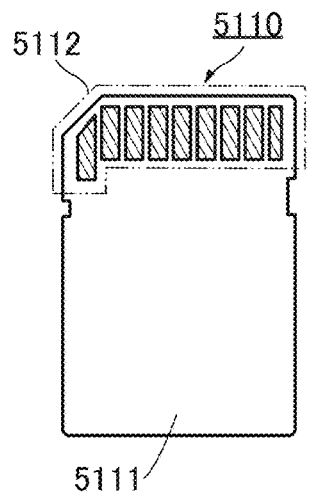
Figure 21C:
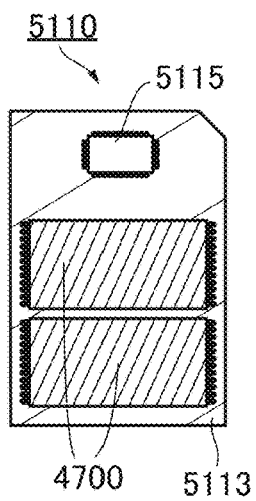

FIG. 21B is a schematic external view of an SD card, and FIG. 21C is a schematic view of the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a semiconductor device and a circuit for driving the semiconductor device. For example, electronic components 4700 and a controller chip 5115 are attached to the substrate 5113. Note that the circuit structures of the electronic components 4700 and the controller chip 5115 are not limited to those described above, and can be changed as appropriate according to circumstances. For example, a write circuit, a row driver, a read circuit, and the like that are provided in an electronic component may be incorporated into the controller chip 5115 instead of the electronic component 4700.

When the electronic components 4700 are provided also on a rear surface side of the substrate 5113, the capacitance of the SD card 5110 can be increased. In addition, a wireless chip with a wireless communication function may be provided on the substrate 5113. This allows wireless communication between an external device and the SD card 5110 and enables data reading and writing from and to the electronic components 4700.

[SSD]

The semiconductor device described in the above embodiment can be employed for an SSD (Solid State Drive) that can be attached to an electronic device such as an information terminal.

Figure 21D:
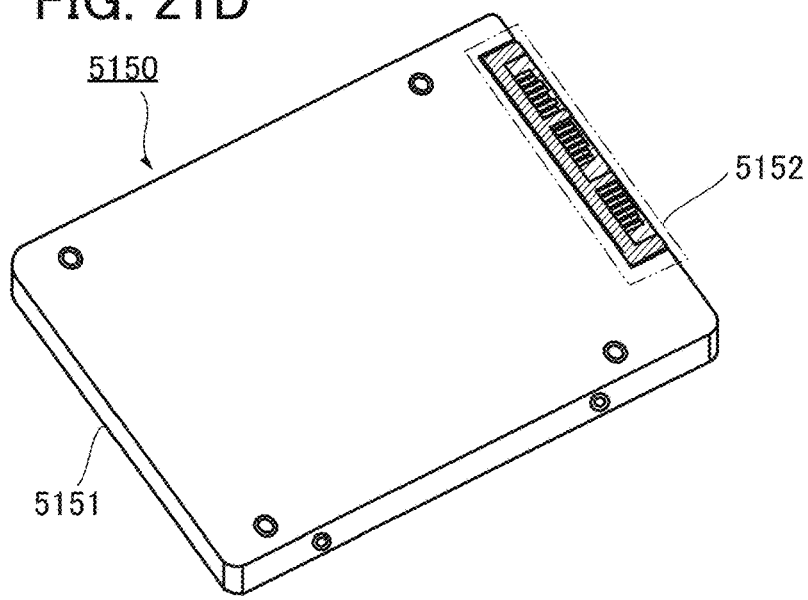
Figure 21E:
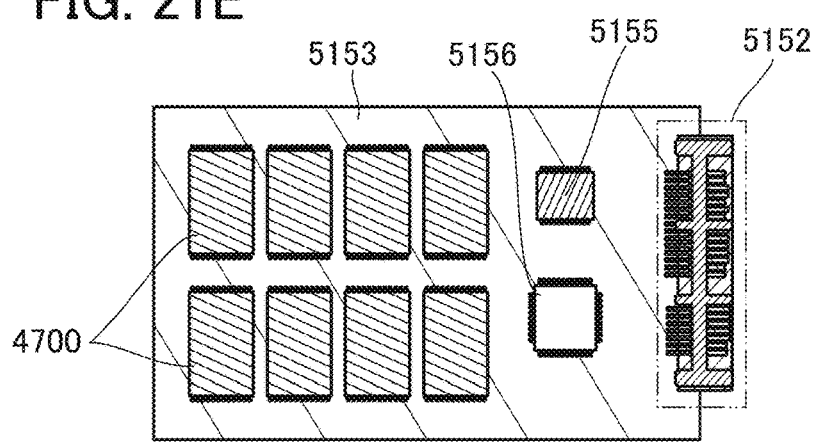

FIG. 21D is a schematic external view of an SSD, and FIG. 21E is a schematic view of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a semiconductor device and a circuit for driving the semiconductor device. For example, the electronic components 4700, a memory chip 5155, and a controller chip 5156 are attached to the substrate 5153. When the electronic components 4700 are also provided on a rear surface side of the substrate 5153, the capacity of the SSD 5150 can be increased. A work memory is incorporated in the memory chip 5155. For example, a DRAM chip is used as the memory chip 5155. A processor, an ECC circuit, and the like are incorporated in the controller chip 5156. Note that the circuit structures of the electronic components 4700, the memory chip 5155, and the controller chip 5115 are not limited to those described above, and the circuit structures can be changed as appropriate according to circumstances. For example, a memory functioning as a work memory may also be provided in the controller chip 5156.

[Computer]

Figure 22A:
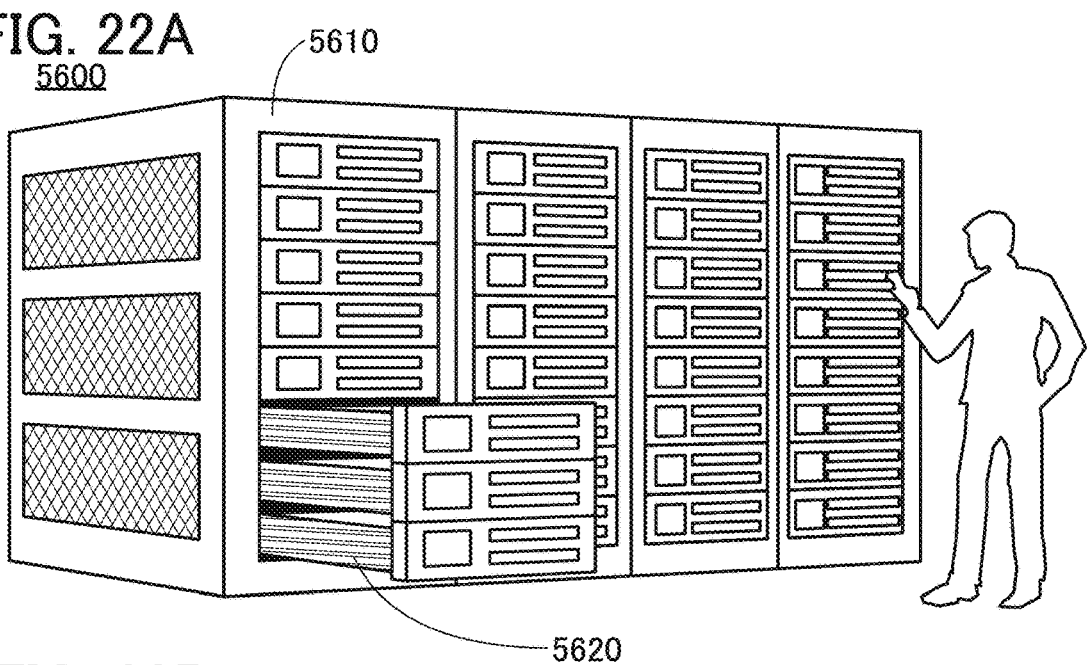
FIG. 22A to FIG. 22C are diagrams illustrating examples of electronic devices.

A computer 5600 illustrated in FIG. 22A is an example of a large computer. In the computer 5600, a plurality of rack mount computers 5620 are stored in a rack 5610.

Figure 22B:
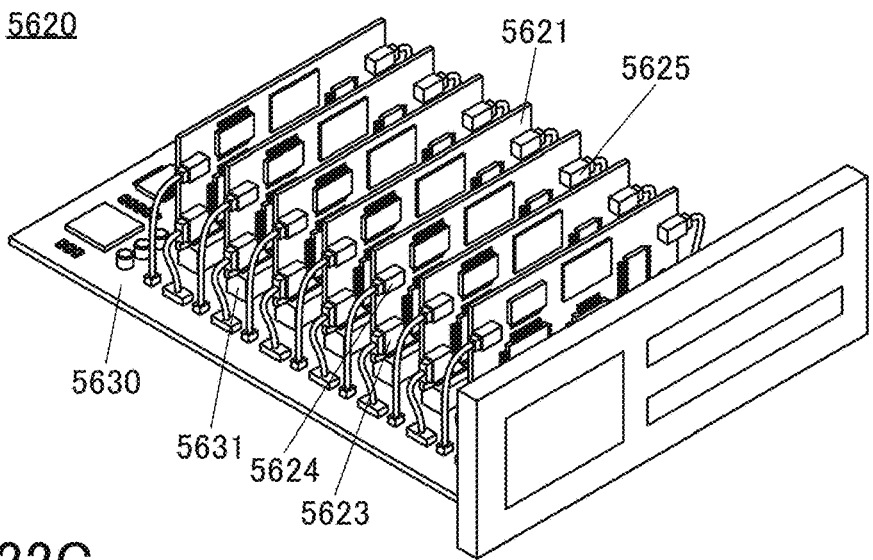

The computer 5620 can have a structure in a perspective view illustrated in FIG. 22B, for example. In FIG. 22B, the computer 5620 includes a motherboard 5630, and the motherboard 5630 includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

Figure 22C:
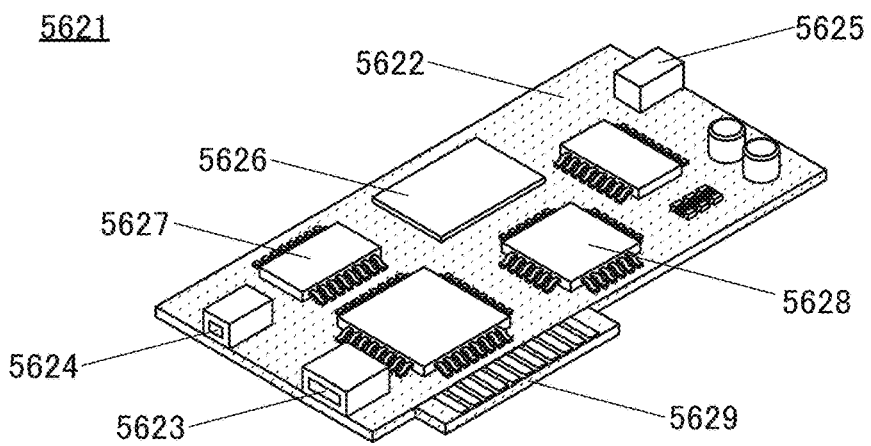

The PC card 5621 illustrated in FIG. 22C is an example of a processing board provided with a CPU, a GPU, a semiconductor device, and the like. The PC card 5621 includes a board 5622. In addition, the board 5622 includes a connection terminal 5623, a connection terminal 5624, a connection terminal 5625, a semiconductor device 5626, a semiconductor device 5627, a semiconductor device 5628, and a connection terminal 5629. Note that FIG. 22C also illustrates semiconductor devices other than the semiconductor device 5626, the semiconductor device 5627, and the semiconductor device 5628, the following description of the semiconductor device 5626, the semiconductor device 5627, and the semiconductor device 5628 is referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe or the like.

The connection terminal 5623, the connection terminal 5624, and the connection terminal 5625 can serve as, for example, an interface for performing power supply, signal input, or the like to the PC card 5621. As another example, they can serve as an interface for outputting a signal calculated by the PC card 5621. Examples of the standard for each of the connection terminal 5623, the connection terminal 5624, and the connection terminal 5625 include USB (Universal Serial Bus), SATA (Serial ATA), SCSI (Small Computer System Interface), and the like. In the case where video signals are output from the connection terminal 5623, the connection terminal 5624, and the connection terminal 5625, an example of the standard therefor is HDMI (registered trademark) or the like.

The semiconductor device 5626 includes a terminal (not illustrated) for inputting and outputting signals, and when the terminal is inserted in a socket (not illustrated) of the board 5622, the semiconductor device 5626 and the board 5622 can be electrically connected to each other.

The semiconductor device 5627 includes a plurality of terminals, and when the terminals are reflow-soldered, for example, to wirings of the board 5622, the semiconductor device 5627 and the board 5622 can be electrically connected to each other. Examples of the semiconductor device 5627 include an FPGA (Field Programmable Gate Array), a GPU, a CPU, and the like. As the semiconductor device 5627, the electronic component 4730 can be used, for example.

The semiconductor device 5628 includes a plurality of terminals, and when the terminals are reflow-soldered, for example, to wirings of the board 5622, the semiconductor device 5628 and the board 5622 can be electrically connected to each other. An example of the semiconductor device 5628 is a semiconductor device or the like. As the semiconductor device 5628, the electronic component 4700 can be used, for example.

The computer 5600 can also function as a parallel computer. When the computer 5600 is used as a parallel computer, large-scale computation necessary for artificial intelligence learning and inference can be performed, for example.

The semiconductor device of one embodiment of the present invention is used in a variety of electronic devices or the like described above, so that a reduction in size, an increase in speed, or a reduction in power consumption of the electronic device can be achieved. In addition, since the semiconductor device of one embodiment of the present invention has low power consumption, heat generation from a circuit can be reduced. Accordingly, it is possible to reduce adverse effects of the heat generation on the circuit itself, a peripheral circuit, and a module. Furthermore, the use of the semiconductor device of one embodiment of the present invention can achieve an electronic device that operates stably even in a high temperature environment. Thus, the reliability of the electronic devices can be increased.

This embodiment can be combined as appropriate with any of the other embodiments and the like described in this specification.

Example

Operation of the semiconductor device 100 in FIG. 1A was examined with a circuit simulator. SmartSpice manufactured by Silvaco, Inc. was used as the circuit simulator.

As an examination condition, the transistor Tr11 and the transistor Tr21 were assumed to be OS transistors with a channel length of 60 nm and a channel width of 60 nm. The transistor Tr12 and the transistor Tr22 were assumed to be Si transistors with a channel length of 1 μm and a channel width of 1 μm. The capacitance value of each of the capacitor Cb1 and the capacitor Cb2 was 1 pF. Furthermore, VSS was set at 0.0 V and VDD was set at 6.0 V.

Five levels (0.9 V, 1.1 V, 1.3 V, 1.5 V, and 1.7 V) of Vin1 held in the node SN1 and two levels (0.0 V and 0.7 V) of Vref held in the node SN2 were assumed, and all combinations of output voltage Vout were calculated with the circuit simulator. Note that each of the five levels of Vin1 satisfies Expression 6 and Expression 7 shown in the above embodiment.

Figure 23A:
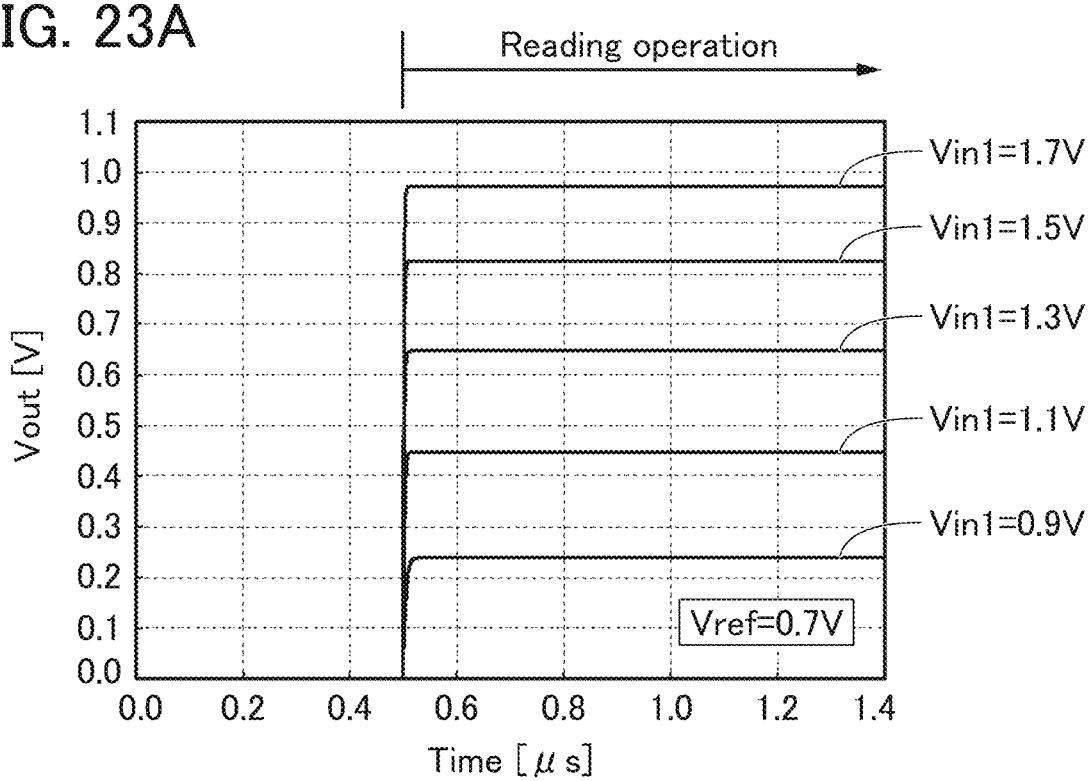
FIG. 23A and FIG. 23B are graphs of Example.
Figure 23B:
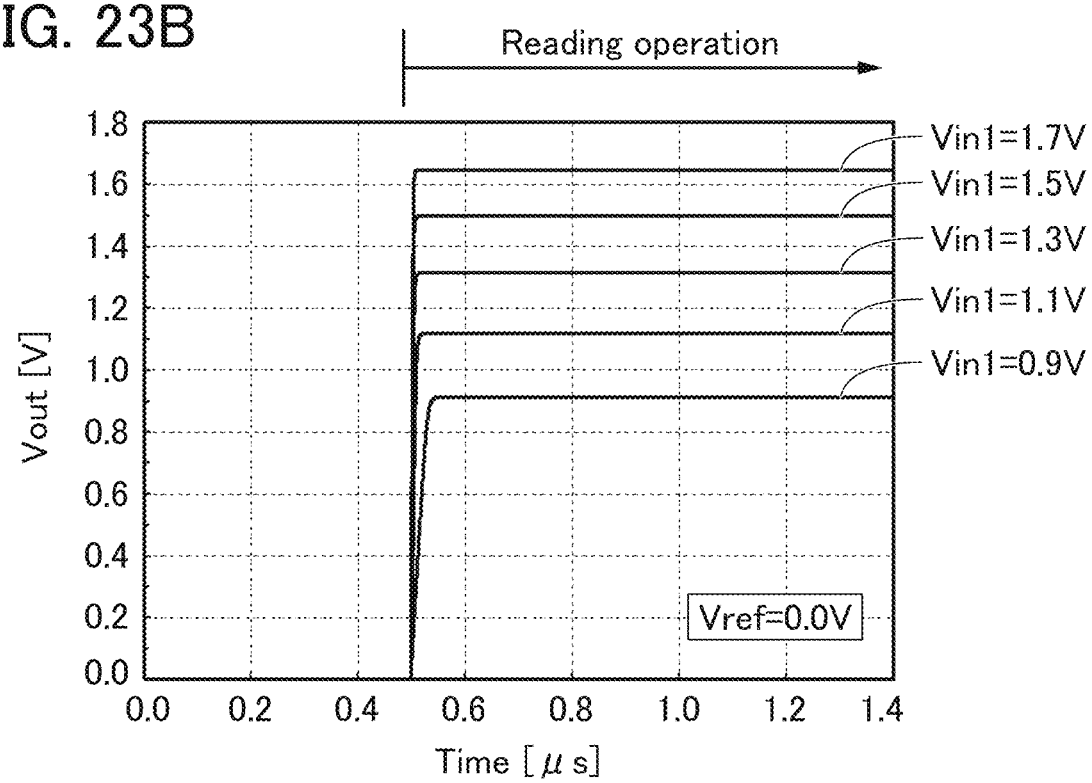

The calculation results are shown in FIG. 23A and FIG. 23B. In FIG. 23A and FIG. 23B, the vertical axis represents the output voltage Vout and the horizontal axis represents time (Time). In this example, the writing operation described in the above embodiment has been terminated at time 0.0 μs. More specifically, the period T32 described in the above embodiment has been terminated and the potentials of the node SN1 and the node SN2 are held.

FIG. 23A shows output voltages Vout at the respective Vin1 levels when Vref is 0.7 V. FIG. 23B shows output voltages Vout at the respective Vin1 levels when Vref is 0.0 V.

In the semiconductor device 100, VSS is supplied to the terminal PS1 and the terminal PS2 until time 0.5 μs. When time becomes 0.5 μs, reading operation starts. During the reading operation, VDD is supplied to the terminal PS1 and the output voltage Vout is supplied to the terminal OUT.

Figure 24:
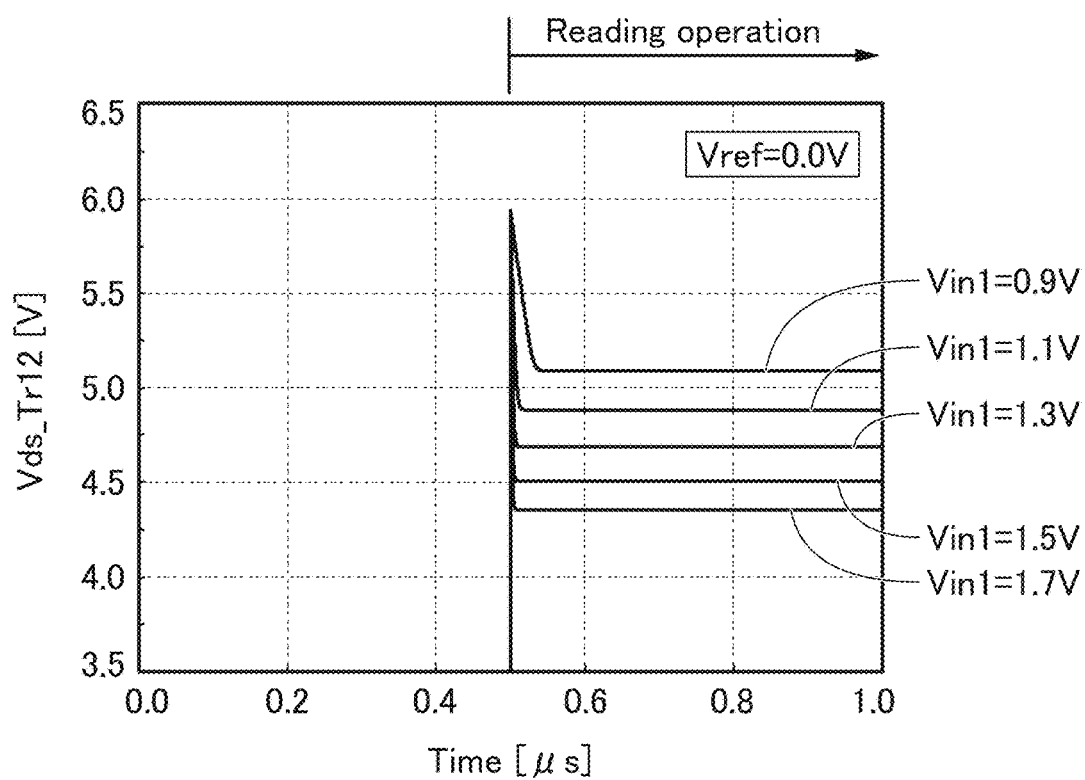
FIG. 24 is a graph of Example.

FIG. 24 shows calculation results of a voltage Vds_Tr12 between the source and the drain of the transistor Tr12 after the reading operation starts. Since the potential of the node BN until just before the reading operation starts is VSS (0.0 V), Vds_Tr12 is approximately 6 V just after the potential of the terminal PS1 changes from VSS to VDD (6.0 V).

Since Vin1 is higher than or equal to the threshold voltage of the transistor Tr12, when the potential of the terminal PS1 becomes VDD, a current flows between the source and the drain of the transistor Tr12 and thus the potential of the node BN increases. The higher Vin1 is, the larger the amount of current flowing between the source and the drain of the transistor Tr12 becomes. Thus, the potential of the node BN increases as Vin1 is higher. That is, the higher Vin1 is, the lower Vds_Tr12 becomes. As a result, in the case where Vref is constant, Vout increases as Vin1 is higher.

FIG. 23A and FIG. 23B show that a voltage corresponding to Expression 5 described in the above embodiment can be obtained as the output voltage Vout. Note that in this example, Vin2 in Expression 5 corresponds to Vref.

Figure 25:
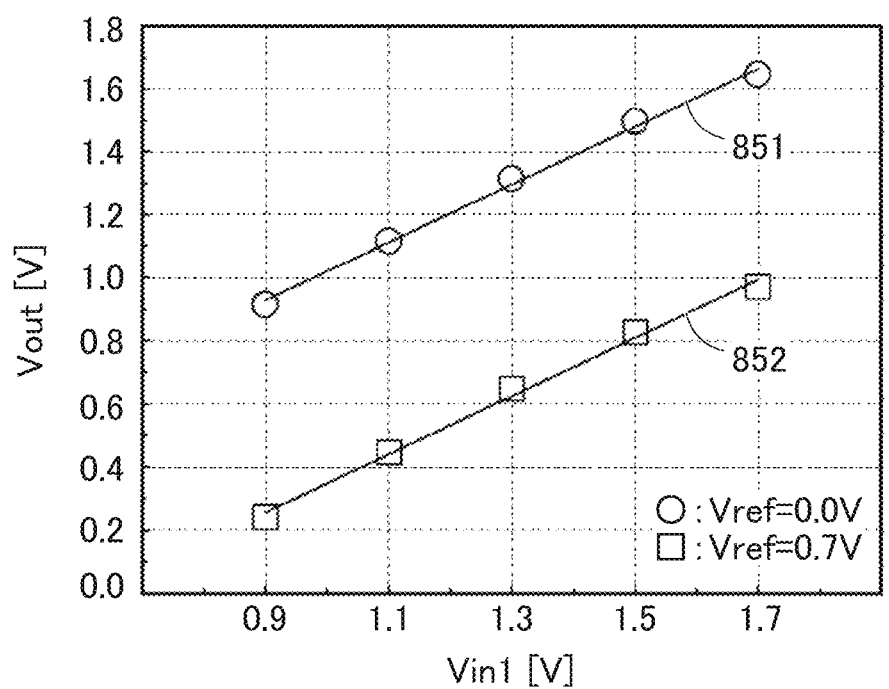
FIG. 25 is a graph of Example.

FIG. 25 is a graph showing the relation between Vin1 and Vout calculated with the circuit simulator. In the graph, circles (o) show the relation between Vin1 and Vout at the time when Vref is 0.0 V, and squares ( ) show the relation between Vin1 and Vout at the time when Vref is 0.7 V.

In FIG. 25, an approximate straight line 851 and an approximate straight line 852 are shown. The approximate straight line 851 is an approximate straight line of the circles (o), and approximates the relation between Vin1 and Vout when Vref is 0.0 V. The approximate straight line 852 is an approximate straight line of the squares ( ), and approximates the relation between Vin1 and Vout when Vref is 0.7 V. The determination coefficient $R^2$ (contribution rate) of the approximate straight line 851 is 0.9966, and the determination coefficient $R^2$ (contribution rate) of the approximate straight line 852 is 0.9955. This indicates that the output voltage Vout changes in accordance with a change in Vin1 when Vref is constant.

The examination with the circuit simulator shows that in the semiconductor device 100 of one embodiment of the present invention, the output voltage Vout changes in accordance with a change in Vin1 when Vref is constant. It is also shown that the semiconductor device 100 of one embodiment of the present invention can accurately read analog data held.

REFERENCE NUMERALS

100: semiconductor device, 110a: holding circuit, 110b: holding circuit, 120a: bootstrap circuit, 120b: bootstrap circuit, 130: source follower circuit, Tr11: transistor, Tr12: transistor, Tr21: transistor, Tr22: transistor, SN1: node, SN2: node, BN: node, Cb1: capacitor, Cb2: capacitor, IN1: terminal, IN2: terminal, PS1: terminal, PS2: terminal, WW1: terminal, WW2: terminal

The invention claimed is:

1. A semiconductor device comprising a first circuit, a second circuit and a source follower,
   wherein the first circuit is configured to hold a first potential,
   wherein the second circuit is configured to hold a second potential,
   wherein the source follower is configured to output an output signal while the first potential and the second potential held in the first circuit and the second circuit are increased.

2. The semiconductor device according to claim 1, comprising first to fourth transistors, a first capacitor, and a second capacitor,
   wherein the first circuit comprises the first transistor and the first capacitor,
   wherein the second circuit comprises the third transistor and the second capacitor, and
   wherein the source follower comprises the second transistor and the fourth transistor.

3. The semiconductor device according to claim 1,
   wherein each of the first transistor and the third transistor comprises an oxide semiconductor in a semiconductor layer where a channel is formed.

4. The semiconductor device according to claim 3,
   wherein each of the second transistor and the fourth transistor comprises an oxide semiconductor in a semiconductor layer where a channel is formed.

5. The semiconductor device according to claim 3,
   wherein the oxide semiconductor comprises at least one of indium and zinc.

6. A semiconductor device comprising first to fourth transistors, a first capacitor, and a second capacitor,
   wherein one of a source and a drain of the first transistor is electrically connected to a first terminal,
   wherein the other of the source and the drain of the first transistor is electrically connected to a gate of the second transistor,
   wherein a gate of the first transistor is electrically connected to a second terminal,
   wherein one of a source and a drain of the third transistor is electrically connected to a third terminal,
   wherein the other of the source and the drain of the third transistor is electrically connected to a gate of the fourth transistor,
   wherein a gate of the third transistor is electrically connected to a fourth terminal,
   wherein one of a source and a drain of the second transistor is electrically connected to a fifth terminal,
   wherein the other of the source and the drain of the second transistor is electrically connected to a seventh terminal,
   wherein one of a source and a drain of the fourth transistor is electrically connected to a sixth terminal,
   wherein the other of the source and the drain of the fourth transistor is electrically connected to the seventh terminal,
   wherein one electrode of the first capacitor is electrically connected to the gate of the second transistor,
   wherein the other electrode of the first capacitor is electrically connected to the seventh terminal,
   wherein one electrode of the second capacitor is electrically connected to the gate of the fourth transistor,
   wherein the other electrode of the second capacitor is electrically connected to the seventh terminal, and
   wherein the semiconductor device is configured to output a potential corresponding to a potential difference between a potential of the gate of the second transistor and a potential of the gate of the fourth transistor to the seventh terminal when the first transistor and the third transistor are both in an off state.

7. The semiconductor device according to claim 6,
   wherein analog data is supplied to the first terminal.

8. The semiconductor device according to claim 6,
   wherein the third terminal is electrically connected to the sixth terminal.

9. The semiconductor device according to claim 6,
   wherein each of the first transistor and the third transistor comprises an oxide semiconductor in a semiconductor layer where a channel is formed.

10. The semiconductor device according to claim 9,
    wherein each of the second transistor and the fourth transistor comprises an oxide semiconductor in a semiconductor layer where a channel is formed.

11. The semiconductor device according to claim 9,
    wherein the oxide semiconductor comprises at least one of indium and zinc.

12. The semiconductor device according to claim 1, wherein the source follower is configured to output a third potential corresponding to a potential difference between the increased first potential and the increased second potential.

13. The semiconductor device according to claim 1, wherein the first circuit is configured to input the first potential to the source follower, and
wherein the second circuit is configured to input the second potential to the source follower.

* * * * *